US008854449B2

(12) United States Patent
Aikawa et al.

(10) Patent No.: US 8,854,449 B2
(45) Date of Patent: Oct. 7, 2014

(54) SUBSTRATE POSITION DETECTION APPARATUS, FILM DEPOSITION APPARATUS EQUIPPED WITH THE SAME, AND SUBSTRATE POSITION DETECTION METHOD

(75) Inventors: Katsuyoshi Aikawa, Iwate (JP); Manabu Honma, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 653 days.

(21) Appl. No.: 13/236,700

(22) Filed: Sep. 20, 2011

(65) Prior Publication Data

US 2012/0075460 A1 Mar. 29, 2012

(30) Foreign Application Priority Data

Sep. 28, 2010 (JP) .................. 2010-217253
Jul. 7, 2011 (JP) .................. 2011-151081

(51) Int. Cl.
| | | |
|---|---|---|
| H01L 21/66 | (2006.01) | |
| C23C 16/44 | (2006.01) | |
| H01L 21/687 | (2006.01) | |
| C23C 16/52 | (2006.01) | |
| C23C 16/455 | (2006.01) | |
| H01L 21/67 | (2006.01) | |
| H01L 21/68 | (2006.01) | |

(52) U.S. Cl.
CPC .......... *H01L 21/68764* (2013.01); *C23C 16/44* (2013.01); *H01L 21/68742* (2013.01); *H01L 21/68771* (2013.01); *C23C 16/52* (2013.01); *C23C 16/45551* (2013.01); *H01L 21/67259* (2013.01); *H01L 21/68721* (2013.01); *H01L 21/681* (2013.01)

USPC ........................................... 348/87

(58) Field of Classification Search
None
See application file for complete search history.

(56) References Cited

U.S. PATENT DOCUMENTS

| 6,522,942 B2 * | 2/2003 | Kondo et al. ................ 700/218 |
| 8,159,653 B2 * | 4/2012 | Shindo .......................... 355/72 |
| 2010/0055312 A1 * | 3/2010 | Kato et al. ................ 427/255.26 |

FOREIGN PATENT DOCUMENTS

JP 2010-153769 7/2010

* cited by examiner

*Primary Examiner* — Sath V Perungavoor
*Assistant Examiner* — Kate Luo
(74) *Attorney, Agent, or Firm* — IPUSA, PLLC

(57) ABSTRACT

A substrate position detection method includes rotating the susceptor so that the substrate receiving portion is moved into an image taking area of a imaging apparatus; detecting first two position detection marks provided in the process chamber so that the first two position detection marks are within the image taking area, wherein a first perpendicular bisector of the first two position detection marks passes through a rotational center of the susceptor; detecting second two position detection marks provided in the susceptor so that the second two position detection marks can be within the image taking area, wherein a second perpendicular bisector of the second two position detection marks passes through the rotational center of the susceptor and a center of the substrate receiving portion; and determining whether the substrate receiving portion is positioned in a predetermined range in accordance with the detected first two and second two position detection marks.

10 Claims, 15 Drawing Sheets

SUBSTRATE POSITION DETECTION APPARATUS, FILM DEPOSITION APPARATUS EQUIPPED WITH THE SAME, AND SUBSTRATE POSITION DETECTION METHOD

CROSS-REFERENCE TO RELATED APPLICATION

This application claims the benefit of priority of Japanese Patent Applications No. 2010-217253 and No. 2011-151081, filed on Sep. 28, 2010 and Jul. 7, 2011, respectively, with the Japanese Patent Office, the entire contents of which are hereby incorporated by reference.

BACKGROUND OF THE INVENTION

1. Field of the Invention

The present invention relates to a substrate position detection apparatus that detects a position of a substrate housed in a semiconductor device fabrication apparatus and the like, a film deposition apparatus equipped with the substrate position detection apparatus, and a substrate position detection method.

2. Description of the Related Art

In a semiconductor device fabrication process, a substrate is transferred into various fabrication apparatuses including a film deposition apparatus, an etching apparatus, an inspection apparatus and the like, and undergoes corresponding processes. The substrate is transferred into the fabrication apparatuses by a transfer arm having a fork or an end effector. The substrate transferred by the transfer arm has to be accurately positioned in a predetermined position. For example, when the substrate deviates from the predetermined position, the substrate cannot be uniformly heated, thereby degrading uniformity in film thickness and/or film properties. In addition, such deviation may cause a problem in that the substrate cannot be taken away by the fork or an end effector.

Moreover, among some molecular layer deposition (MLD) apparatuses, which have attracted much attention because of their thickness controllability and uniformity, there is an MLD apparatus where a substrate is rotated at relatively high speed so that reaction gases are alternately adsorbed, instead of alternately supplying the reaction gases. In such an apparatus, the substrate may be ejected by the rotation if the substrate is not in a predetermined place.

In order to solve such problems by accurately arranging the substrates in predetermined positions, there is proposed a method in which a charge coupled device (CCD) camera or the like is used to take an image of the substrate, thereby detecting the position of the substrate in accordance with the image (see Patent Document 1). According to this method, because an image of not only the substrate but also a susceptor can be taken by one CCD camera, an optical system can be simplified, which is advantageous in terms of reduced costs, and a remote detection can be realized.

Patent document 1: Japanese Patent Application Laid-Open Publication No. 2010-153769.

SUMMARY OF THE INVENTION

When the substrate position, for example, in the ALD apparatus is detected by using a substrate position detection apparatus having the CCD camera or the like, the substrate position detection apparatus is arranged on or above a ceiling plate of a chamber of the ALD apparatus in order to take an image of the substrate and the susceptor on which the substrate is placed using the CCD camera or the like through a window provided in the ceiling plate.

Incidentally, the ceiling plate may be removed from a chamber body in order to carry out preventive maintenance of the chamber. After such preventive maintenance, the substrate position detection apparatus has to be attached on the ceiling plate with extremely high accuracy in relation to the chamber. When the substrate position detection apparatus (or the CCD camera) deviates from the desired position, the position of the substrate in relation to the susceptor also deviates, and thus accurate detection of the substrate position cannot be carried out. On the other hand, when the substrate position detection apparatus is arranged with high accuracy in order to avoid such a problem, it takes long time, which may cause another problem of reduced usage accuracy of the ALD apparatus.

The present invention has been made in the view of the above, and is directed to provide a substrate position detection apparatus that enables accurate detection of a substrate in a chamber of a semiconductor fabrication apparatus without demanding for accurate arrangement of the substrate position detection apparatus in relation to the chamber, and a film deposition apparatus equipped with the substrate position detection apparatus, and a substrate position detection method.

A first aspect of the present invention provides a substrate position detection method carried out in a semiconductor fabrication apparatus provided with a process chamber where a predetermined process is carried out with respect to a substrate, and a susceptor that is rotatably housed in the process chamber and has a substrate receiving portion in which the substrate subject to a position detection is placed. The substrate position detection method includes steps of causing the susceptor to move so that the substrate receiving portion is positioned in an image taking area of a imaging apparatus; detecting first two position detection marks provided in the process chamber so that the first two position detection marks are within the image taking area, wherein a first perpendicular bisector of the first two position detection marks passes through a rotational center of the susceptor; detecting second two position detection marks provided in the susceptor so that the second two position detection marks can be within the image taking area, wherein a second perpendicular bisector of the second two position detection marks passes through the rotational center of the susceptor and a center of the substrate receiving portion; and determining whether the substrate receiving portion is positioned in a predetermined range in accordance with the detected first two position detection marks and the detected second two position detection marks.

A second aspect of the present invention provides a substrate position detection apparatus used in a semiconductor fabrication apparatus provided with a process chamber where a predetermined process is carried out with respect to a substrate, and a susceptor that is rotatably housed in the process chamber and has a substrate receiving portion in which the substrate subject to a position detection is placed, thereby to detect a position of a substrate. The substrate position detection apparatus includes an image taking unit that takes an image of an area that includes: first two position detection marks provided in the process chamber so that the first two position detection marks are within the image taking area, wherein a first perpendicular bisector of the first two position detection marks passes through a rotational center of the susceptor, second two position detection marks provided in the susceptor so that the second two position detection marks can be within the image taking area, wherein a second perpendicular bisector of the second two position detection marks passes through the rotational center of the susceptor and a center of the substrate receiving portion, and a circumferential area of the substrate receiving portion; and a control portion that detects the first two position detection marks and the second two position detection marks in accordance with the image taken by the image taking unit and determines whether the substrate receiving portion is positioned in a predetermined range in accordance with the detected first two position detection marks and the detected second two position detection marks.

A second aspect of the present invention provides a film deposition apparatus for depositing a film on a substrate by carrying out a cycle of alternately supplying at least two kinds of reaction gases that react with each other to the substrate to produce a layer of a reaction product in a chamber. The film deposition apparatus includes a susceptor rotatably provided in the chamber; a substrate receiving portion that is provided in one surface of the susceptor in which the substrate is placed; a substrate position detection apparatus for detecting a position of the substrate placed in the substrate receiving portion; a first reaction gas supplying portion configured to supply a first reaction gas to the one surface; a second reaction gas supplying portion configured to supply a second reaction gas to the one surface, the second reaction gas supplying portion being separated from the first reaction gas supplying portion along a rotation direction of the susceptor; a separation area located along the rotation direction between a first process area in which the first reaction gas is supplied and a second process area in which the second reaction gas is supplied; a center area that is located substantially in a center portion of the chamber in order to separate the first process area and the second process area, and has an ejection hole that ejects a first separation gas along the one surface; and an evacuation opening provided in the chamber in order to evacuate the chamber. The separation area includes a separation gas supplying portion that supplies a second separation gas, and a ceiling surface that creates in relation to the one surface of the susceptor a thin space in which the second separation gas may flow from the separation area to the process area side in relation to the rotation direction.

DETAILED DESCRIPTION OF THE PREFERRED EMBODIMENT

Figure 1:
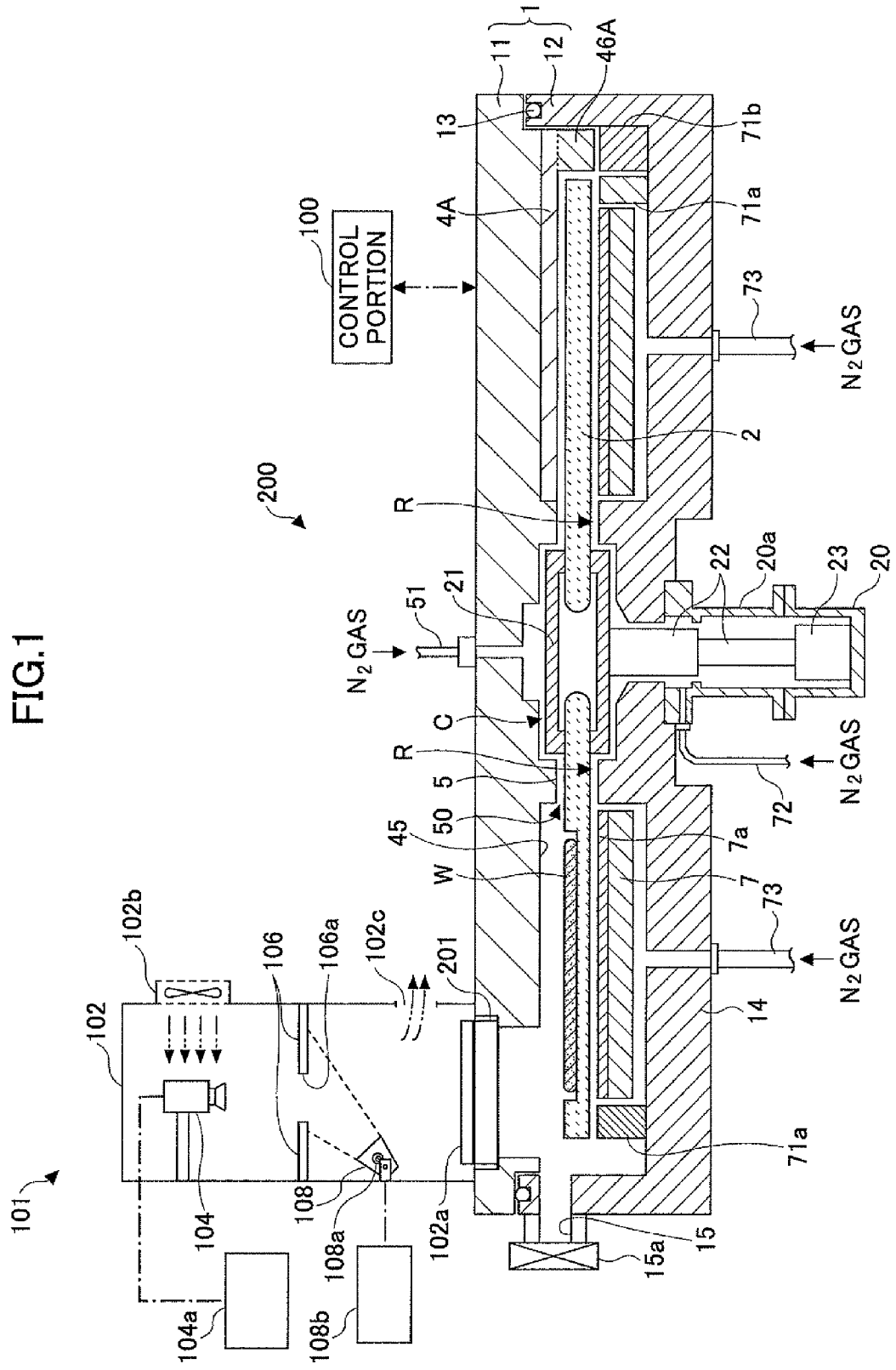
FIG. 1 is a schematic cross-sectional view illustrating a film deposition apparatus equipped with a substrate position detection apparatus according to a first embodiment of the present invention.

According to an embodiment of the present invention, there are provided a substrate position detection apparatus that enables accurate detection of a substrate in a chamber of a semiconductor fabrication apparatus without demanding for accurate arrangement of the substrate position detection apparatus in relation to the chamber, and a film deposition apparatus equipped with the substrate position detection apparatus, and a substrate position detection method.

Non-limiting, exemplary embodiments of the present invention will now be described with reference to the accompanying drawings. In the drawings, the same or corresponding reference symbols are given to the same or corresponding members or components. It is to be noted that the drawings are illustrative of the invention, and there is no intention to indicate scale or relative proportions among the members or components. Therefore, the specific thickness or size should be determined by a person having ordinary skill in the art in view of the following non-limiting embodiments.

(A First Embodiment)

Figure 2:
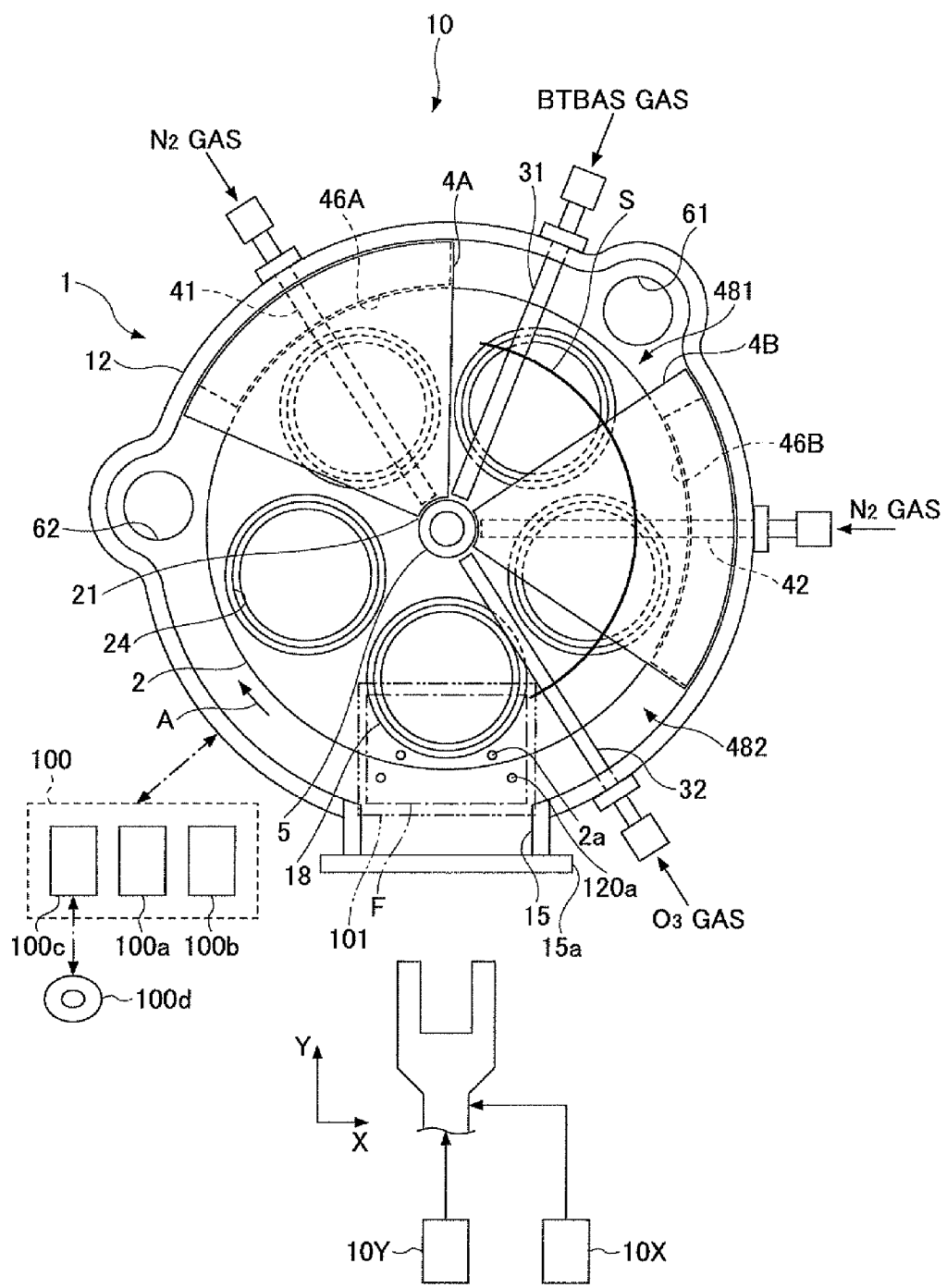
FIG. 2 is a plan view of the film deposition apparatus of FIG. 1.

Referring to FIGS. 1 through 4, a film deposition apparatus according to a first embodiment of the present invention is explained. As shown in FIGS. 1 and 2, a film deposition apparatus 200 according to this embodiment is provided with a vacuum chamber 1, and a susceptor 2 that is provided inside the vacuum chamber 1 and has a rotational center at a center of the vacuum chamber 1.

As shown in FIGS. 1 and 2, the vacuum chamber 1 has a chamber body 12 having a flattened cylinder shape with a bottom, and a ceiling plate 11 that is placed on the upper circumferential surface of the chamber body 12 with a sealing member 13 such as an O-ring. The ceiling plate 11 and the chamber body 12 are made of metal such as aluminum. The ceiling plate 11 is provided is a transparent window 201 that is made of, for example, quartz in an airtight manner by way of a sealing member (not shown) such as an O-ring. The transparent window 201 is located adjacent to a transfer opening 15 that is open in a circumferential wall of the chamber body 12. The transfer opening 15 is provided in order to allow a substrate to be transferred therethrough into or out from the vacuum chamber 1. The transfer opening 15 is provided with a gate valve 15a by which the transfer opening is opened or closed.

In addition, the film deposition apparatus 200 is provided with a substrate position detection apparatus 101 according to an embodiment of the present invention. Specifically, the substrate position detection apparatus 101 is arranged above the transparent window 201 provided in the ceiling plate 11 of the film deposition apparatus 200. The substrate position detection apparatus 101 includes a chassis 102, a camera 104 provided inside the chassis 102 to take an image of a wafer W subject to the position detection, a panel 106 arranged below the camera 104 in the chassis 102, and a light source 108 configured to illuminate the panel 106.

The chassis 102 has an opening at a bottom portion thereof, and the opening is covered by a transparent window 102a that opposes the transparent window 201 of the ceiling plate 11. In addition, a fan 102b is provided on an upper side wall of the chassis 102 and an opening 102c is formed on a lower side wall of the chassis 102. As shown by a two-dotted line in FIG. 1, outer air is blown toward the camera 104 by the fan 102b and evacuated through the opening 102c, so that the camera 104 is cooled. Moreover, when detecting a position of the wafer W, if the wafer W is heated in the film deposition apparatus 200, the transparent window 102a is heated by heat radiation from the wafer W and a susceptor on which the substrate is placed, and thus hot air current may be caused, which may blur the image of the wafer W. However, because the transparent window 102a can also be cooled by the fan 102b, the blurring of the image due to the hot air current is reduced.

The camera 104 includes a charge-coupled device (CCD) as an imaging device, and is attached on an inner upper portion of the chassis 102 to face the window 102a. With this configuration, the camera 104 can take an image of the wafer W placed on the susceptor 2 in the film deposition apparatus 200 through the window 102a and the transparent window 201 of the ceiling plate 11 of the film deposition apparatus 200. Especially, because the transparent window 201 of the ceiling plate 11 is formed adjacent to the transfer opening 15, an image of the wafer W can be taken right after the wafer W is transferred into the vacuum chamber 1 or right before the wafer W is transferred out from the vacuum chamber 1. In other words, the image of the wafer W can be swiftly taken at the time of transferring in-and-out of the wafer W.

In addition, a control portion 104a is electrically connected to the camera 104. The control portion 104a controls operations (on/off, focusing, image-taking, and the like) of the camera 104, and processes image data obtained by the camera 104. Such processes may include an arithmetic processing for specifying the position of the wafer W from the image data. Additionally, the control portion 104a may download a program stored in a storage medium through an input/output (I/O) device (not shown), and carries out a substrate position detection method described below by controlling the camera 104, the light source 108, and the like in accordance with the program.

The panel 106 is made of an acrylic plate painted with white pigment and thus has a milky white color, in this embodiment, and is attached between the camera 104 and the window 102a in the chassis 102. An opening 106a is formed in substantially a center of the panel 106, through which the camera 104 can take an image of the wafer W and an area around the wafer W in the film deposition apparatus 200. A dimension and position of the opening 106a may be determined to ensure a field of view F that includes an edge of the wafer W for use in the position detection, susceptor marks 2a formed in the susceptor 2, and chamber marks 120a formed in a bottom of the chamber body 12. In addition, the dimension and position of the opening 106a may be determined taking into consideration a distance between the panel 106 and the camera 104.

Incidentally, the susceptor marks 2a are made by burying a disk plate made of, for example, black quartz into an indented portion formed in the susceptor 2, in this embodiment. The black quartz is preferable when the susceptor 2 is made of quartz. On the other hand, when the susceptor 2 is made of carbon, the susceptor marks 2a are preferably made by burying a disk plate made of, for example, alumina into the indented portion.

Figure 8:
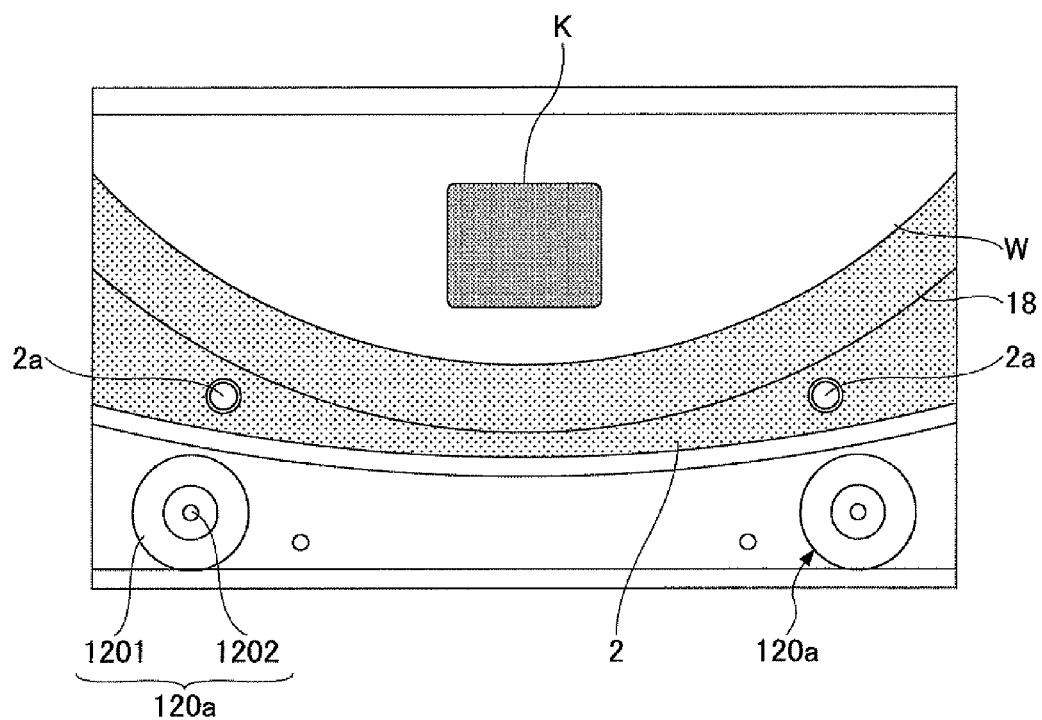
FIG. 8 is a schematic view depicting an image of an area including circumferential areas of the substrate and the susceptor, which is taken by the substrate position detection apparatus according to the embodiment of the present invention.

In addition, the two chamber marks 120a are made by burying a disk plate 1201 made of black quartz and attaching a disk plate 1202 in the center of the disk plate 1201 (see FIG. 8).

The light source 108 is attached in an inner side wall of the chassis 102 between the panel 106 and the window 102a, in this embodiment. Specifically, the light source 108 is arranged so that it can illuminate a lower surface of the panel 106, but does not illuminate the camera 104 through the opening 106a of the panel. The light source 108 illuminates the panel 106, and thus the wafer W and the susceptor 2 in the field of view F (FIG. 2) are indirectly illuminated by the panel 106. The light source 108 may vertically swivel, and preferably have a motor or the like to change illumination directions, upward or downward. With this, the light source 108 can illuminate alternately the panel 106 above the light source 108 or the wafer W below the light source 108.

The light source 108 includes a white light emitting diode (LED) 108a, and is provided with an electric source 108b to supply electricity to the white LED, in this embodiment. The electric source 108b can change its output voltage, so that illumination intensity of the wafer W illuminated indirectly by the panel 106 can be adjusted, which makes it possible for the camera 104 to take a distinct image.

The susceptor 2 housed in the vacuum chamber 1 is provided with plural substrate receiving portions 24 in which the corresponding wafers W are placed. In this embodiment, the substrate receiving portions 24 are realized as concave portions. Specifically, an inner diameter of each of the substrate receiving portions 24 (the concave portions) may be, for example, from about 304 mm through 308 mm when the wafers W have diameters of 300 mm. In addition, the substrate receiving portion 24 has a depth that is substantially the same as a thickness of the wafer W. With this, when the wafer W is placed in the substrate receiving portion 24, the upper surface of the wafer W and an upper surface of an area of the susceptor 2, the area excluding the concave portions 2, are at the same elevation. Because of this, there is substantially no step between the upper surfaces of the wafer W and the susceptor 2, and thus turbulence of the gas flowing over the susceptor 2 caused by such a step can be reduced.

Figure 3:
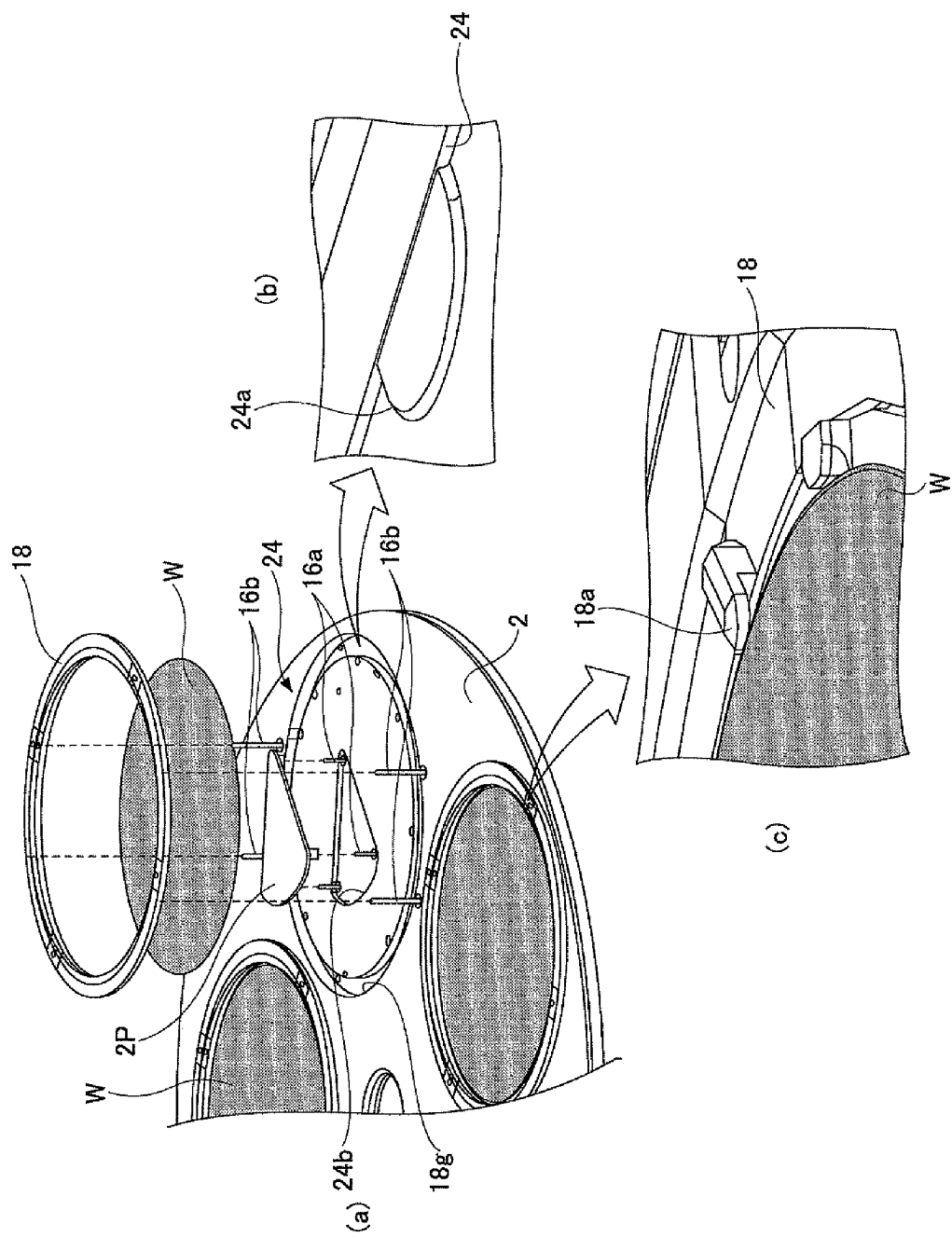
FIG. 3 is a partial cross-sectional view taken along an auxiliary line S in FIG. 1.

In addition, as shown in part (a) of FIG. 3, three through-holes are formed in the substrate receiving portion 24 of the susceptor 2. In addition, there are provided lift pins 16a can move upward or downward through the corresponding through-holes. The three lift pins 16a support and move upward or downward a pusher 2P. Moreover, indented portion 24b having a shape corresponding to a shape of the pusher 2P is formed in the substrate receiving portion 24. When the lift pins 16a are moved downward so that the pusher 2P is housed in the indented portion 24b, an upper surface of the pusher 2P and a bottom surface of the substrate receiving portion 24 are positioned at the same elevation. As shown in part (b) of FIG. 3, plural wafer supporting portions 24a are formed along a circumference of the substrate receiving portion 24, specifically, along an inner side wall of the substrate receiving portion 24. The wafer W placed in the substrate receiving portion 24 is supported by the wafer supporting portions 24a. With this, a constant gap is maintained between the wafer W and the bottom surface of the substrate receiving portion 24, and thus the back surface of the wafer W does not contact the bottom surface of the substrate receiving portion 24. Because of this, the wafer W is heated through the gap between the wafer W and the bottom of the substrate receiving portion 24, the wafer W can be uniformly heated.

Referring again to part (a) of FIG. 3, a circular guide groove 18g is formed along the circumference of the substrate receiving portion 24, and a wafer guide ring 18 is fitted with the guide groove 18g. Part (c) of FIG. 3 illustrates the wafer guide ring 18 that has been fitted with the guide groove 18g. As shown, the wafer guide ring 18 has an inner diameter that is greater than the diameter of the wafer W. When the wafer guide ring 18 is fitted with the guide groove 18g, the wafer W is placed inside the wafer guide ring 18. In addition, crow portions 18a are provided on an upper surface of the wafer guide ring 18. The crow portions 18a extend above the wafer W so that they do not contact the wafer W, and extend toward the center of the wafer guide ring 18 to an extent that is slightly beyond the outer circumference of the wafer W. If a huge pressure change is caused in the vacuum chamber 1 for some reasons, the wafer W may be ejected out from the substrate receiving portion 24 by the huge pressure change. However, the crow portion 18a of the wafer guide ring 18 can hold the wafer W in such an occasion, so that the wafer W can stay in the substrate supporting portion 24.

In addition, four lift pins 16b are provided outside of the guide groove 18g, in order to move upward or downward the wafer guide ring 18. When the wafer guide ring 18 is moved upward and kept at a higher position by the lift pins 16b, the wafer W is transferred between the wafer guide ring 18 and the susceptor 2 by the transfer arm 10A (FIG. 2). After the pusher 2P is moved upward by the lift pins 16a and receives the wafer W from the transfer arm 10A, the transfer arm 10A is withdrawn from the vacuum chamber 1. Next, the pusher 2P is moved downward by the lift pins 16a and housed in the indented portion 24b. With this, the wafer W is supported by the wafer supporting portion 24a and placed in the substrate receiving portion 24. Then, the wafer guide ring 18 is moved downward by the lift pins 16b, and fitted into the guide groove 18g. As a result, the wafer W is assuredly housed in the substrate receiving portion 24 by the wafer guide ring 18.

Referring again to FIG. 1, the susceptor 2 has an opening at the center thereof, and is supported from above and below at and around the opening by a cylindrically shaped core portion 21. The core portion 21 is fixed on a top end of a rotational shaft 22 that extends in a vertical direction. The rotational shaft 22 goes through a bottom portion 14 of the chamber body 12 and is fixed at the lower end thereof to a driving mechanism 23. The core portion 21 and the rotational shaft 22 have a common rotational axis, and can be rotated around the rotational axis by the driving mechanism 23. With this, the susceptor 2 is also rotated.

The rotational shaft 22 and the driving mechanism 23 are housed in a case body 20 having a cylinder with a bottom and an open top end. The case body 20 is hermetically fixed to a bottom surface of the bottom portion 14 via a flanged pipe portion 20a, which isolates an inner environment of the case body 20 from an outer environment.

Referring to FIG. 2, the vacuum chamber 1 is provided with two convex, portions 4A, 4B that are arranged above the susceptor 2 and away from each other along a circumferential direction of the vacuum chamber 1. As shown, the convex portions 4A, 4B have a top view shape of a truncated sector. Each of the convex portions 4A, 4B is located so that an inner arc thereof comes close to a protrusion portion 5 attached on the lower surface of the ceiling plate 11 in order to surround the core portion 21, and an outer arc thereof extends along an inner circumferential surface of the chamber body 12. The convex portions 4A, 4B are attached on the lower surface of the ceiling plate 11 (see FIG. 2 for the convex portion 4A) although the ceiling plate 11 is omitted in FIG. 1 for the convenience of the explanation. The convex portions 4A, 4B are made of metal, for example, aluminum.

Although not illustrated, the convex portion 4B is arranged in the same manner as the convex portion 4A. Because the convex portion 4B has substantially the same configuration and function as the convex portion 4A, the following explanation is made referring mainly to the convex portion 4B.

Figure 4:
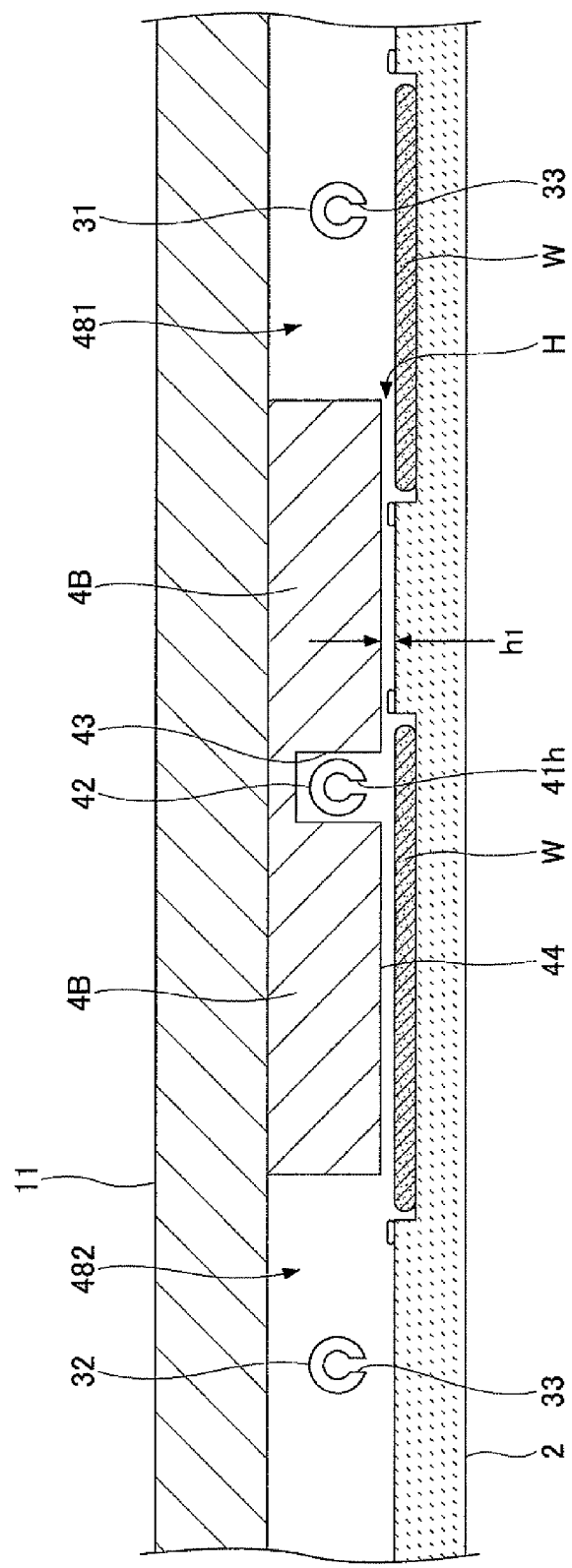
FIG. 4 is an explanatory view for explaining a substrate receiving portion of a susceptor of the film deposition apparatus of FIG. 1.

Referring to FIG. 4, which is a cross-sectional view taken along an auxiliary line S in FIG. 2, the convex portion 45 has a groove portion 43 that extends in the radial direction so that the groove portion 43 substantially bisects the convex portion 4B. A separation gas nozzle 42 is located in the groove portion 43 (see FIG. 2). The separation gas nozzle 42 is introduced into the vacuum chamber 1 from a circumferential wall of the chamber body 12 and extends in the radial direction of the vacuum chamber 1. Specifically, a base end portion of the separation gas nozzle 42 is attached in the circumferential wall of the chamber body 12, so that the separation gas nozzle 42 is supported parallel with the upper surface of the susceptor 2. Incidentally, a separation gas nozzle 41 is arranged in the groove portion 43 of the convex portion 4A in the same manner.

The separation gas nozzle 42 (or 41) is connected to a gas supplying source (not shown) of a separation gas, which may be an inert gas such a noble gas and nitrogen ($N_2$) gas. Alternatively, the separation gas is not limited to the inert gas, but may be any gas as long as the separation gas does not affect the film deposition. In this embodiment, the $N_2$ gas is used as the separation gas. In addition, the separation gas nozzle 42 has plural ejection holes 41h (FIG. 4) through which the $N_2$ gas is ejected toward the susceptor 2. The ejection holes 41h have a diameter of about 0.5 mm and are arranged at intervals of about 10 mm along the longitudinal direction of the separation gas nozzle 42. Moreover, a distance between the separation gas nozzle 42 (or 4a) and the upper surface of the susceptor 2 may be in a range from about 0.5 mm through 4 mm. Incidentally, the ejection holes 41h are formed in the separation gas nozzle 41.

As shown in FIG. 4, a separation space H is formed by the susceptor 2 and the convex portion 4B. A height h1 of the separation space H (or a height from the upper surface of the upper surface to a ceiling surface 44 (or a lower surface of the convex portion 4B)) is preferably in a range from about 0.5 mm through about 10 mm. The height may be about 3.5 mm through about 6.5 mm in order to prevent the susceptor 2 from hitting the ceiling surface 44, although the height h1 is preferably smaller. On both sides of the convex portion 4B, there are formed a first area 481 and a second area 482, which are defined by the upper surface of the susceptor 2 and a lower surface of the ceiling plate 11. Heights of the first area 481 and the second area 482 (or heights of the lower surface of the ceiling plate 11 from the upper surface of the susceptor 2) may be in a range from about 15 mm through about 150 mm. A reaction gas nozzle 31 is provided in the first area 481, and a reaction gas nozzle 32 is provided in the second area 482. The reaction gas nozzles 31, 32 are introduced into the vacuum chamber 1 through a circumferential wall of the chamber body 12, and extend in radius directions, as shown in FIG. 1. Each of the reaction gas nozzles 31, 32 has plural ejection holes 33 that are open downward and arranged at about 10 mm intervals along the longitudinal directions of the reaction gas nozzles 31, (or 32), as shown in FIG. 4. Each of the plural ejection holes 33 has a diameter of about 0.5 mm. A first gas is supplied from the reaction gas nozzle 31, and a second reaction gas is supplied from the reaction gas nozzle 32. In this embodiment, the reaction gas nozzle 31 is connected to a gas source of a bis(tertiary-butylamino)silane (BTBAS) gas as silicon source gas, and the reaction gas nozzle 32 is connected to a gas source of ozone gas as an oxidizing gas that oxidizes the BTBAS into silicon oxide.

When the $N_2$ gas is supplied from the separation gas nozzle 41, the $N_2$ gas flows to the first area 481 and the second area 482 from the separation space H. Because the height h1 of the separation space H is smaller than the heights of the first area 481 and the second area 482, as explained above, a pressure of the separation space H can become easily greater than pressures of the first area 481 and the second area 482. In other words, the height and width of the convex portion 4B and a flow rate of the $N_2$ gas from the separation gas nozzle 41 are preferably determined so that the pressure of the separation space H can be kept greater than the pressures of the first area 481 and the second area 482. When determining, flow rates of the first reaction gas and the second reaction gas, the rotation speed of the susceptor 2, and the like are preferably taken into consideration. In such a manner, the separation space H can provide a pressure wall against the first area 481 and the second area 482, thereby certainly separating the first area 481 and the second area 482.

Specifically, when the first reaction gas (e.g., BTBAS gas) is supplied from the reaction gas nozzle 31 to the first area 481, even if the first reaction gas flows toward the convex portion 4B due to the rotation of the susceptor 2, the first reaction gas cannot flow through the separation space H into the second area 482 because of the pressure wall created in the separation space H, as shown in FIG. 4. In a similar way, when the second reaction gas (e.g., ozone gas) is supplied from the reaction gas nozzle 32 to the second area 482, even if the second reaction gas flows toward the convex portion 4A (FIG. 1) due to the rotation of the susceptor 2, the second reaction gas cannot flow through the separation space H into the first area 481 because of the pressure wall created in the separation space H. Therefore, the first reaction gas and the second reaction gas are effectively impeded from being intermixed through the separation space H. With such a configuration, it has been found that the BTBAS gas and the ozone gas are certainly separated even when the susceptor 2 is rotated at a rotation speed of about 240 revolutions per minute.

Referring again to FIG. 1, the protrusion portion 5 is attached on the lower surface of the ceiling plate 11 in order to surround the core portion 21 that firmly fixes the susceptor 2. The protrusion portion 5 comes close to the upper surface of the susceptor 2. In the illustrated example, a lower surface of the protrusion portion 5 is substantially at the same elevation as the ceiling surface 44 (or the lower surface of the convex portion 4B (or 4A)). In other words, a height of the lower surface of the protrusion portion 5 from the upper surface of the susceptor 2 is the same as the height h1 of the ceiling surface 44. In addition, a distance between the core portion 21 and the ceiling plate 11 and a distance between an inner circumferential surface of the protrusion portion 5 and an outer circumferential surface of the core portion 21 are substantially the same as the height h1 of the ceiling surface 44, in this embodiment. A separation gas supplying pipe 51 is connected to an upper center portion of the ceiling plate 11, and supplies $N_2$ gas. With this $N_2$ gas supplied from the gas supplying pipe 51, spaces between the core portion 21 and the ceiling plate 11, between the inner circumferential surface of protrusion portion 5 and the outer circumferential surface of the core portion 21, and between the protrusion portion 5 and the susceptor 2 can have higher pressure than the pressures of the first area 481 and the second area 482. Incidentally, the spaces may be referred to as a center space hereinafter, for the sake of explanation. Therefore, the center space can provide a pressure wall against the first area 481 and the second area 482, thereby certainly separating the first area 481 and the second area 482. Namely, the first reaction gas (e.g., BTBAS gas) and the second reaction gas (e.g., ozone gas) are effectively impeded from being intermixed through the center space.

As shown in FIG. 1, a ring-shaped heater unit 7 as a heating portion is provided in a space between the bottom portion 14 of the chamber body 12 and the susceptor 2, so that the wafers W placed on the susceptor 2 are heated through the susceptor 2 at a predetermined temperature. In addition, a block member 71a is provided beneath the susceptor 2 and near the outer circumference of the susceptor 2 in order to surround the heater unit 7, so that the space where the heater unit 7 is housed is partitioned from the outside area of the block member 71a. The block member 71a is arranged so that there remains a slight gap between an upper surface of the block member 71a and the back surface of the susceptor 2, in order to impede gas from flowing inside the block member 71a. Plural purge gas supplying pipes 73 are connected at predetermined angular intervals to the space where the heater unit 7 is housed in order to purge this space. Incidentally, a protection plate 7a that protects the heater unit 7 is supported above the heater unit 7 by the block member 71a and a raised portion R (described later). With the protection plate 7a, the heater unit 7 can be protected even when the BTBAS gas and/or the $O_3$ gas flow below the susceptor 2. The protection plate 7a is preferably made of, for example, quartz.

Incidentally, the heater unit 7 may be configured of plural lamp heaters that are placed concentrically. With this, each of the plural lamp heaters can be separately controlled, thereby uniformly heating the susceptor 2.

Referring to FIG. 1, the bottom portion 14 has a raised portion R in an inside area of the ring-shaped heater unit 7. The top surface of the raised portion R comes close to the back surface of the susceptor 2 and the core portion 21, leaving slight gaps between the raised portion R and the susceptor 2 and between the raised portion R and the core portion 21. In addition, the bottom portion 14 has a center hole through which the rotational shaft 22 passes. The inner diameter of the center hole is slightly larger than the diameter of the rotational shaft 22, leaving a gap that allows a pressure communication with the case body 20 through the flanged pipe portion 20a. A purge gas supplying pipe 72 is connected to an upper portion of the flanged pipe portion 20a.

With such a configuration, $N_2$ gas flows from the purge gas supplying pipe 72 into the space where the heather unit 7 is housed through the gap between the center hole of the bottom portion 14 of the chamber body 12 and the rotational shaft 22, and between the raised portion R and the lower surface of the susceptor 2. The $N_2$ gas flows through a gap between the protection plate 7a and the lower surface of the susceptor 2, together with the $N_2$ gas from the purge gas supplying pipes 73, into the evacuation port 61. The $N_2$ gases flowing in such a manner can serve as separation gases that impede the BTBAS (or $O_3$ gas) from being intermixed with the $O_3$ gas (or BTBAS gas) by way of the space below the susceptor 2.

In addition, as shown in FIG. 2, the convex portion 4B has a bent portion 46B that bends in an L-shape from an outer circumferential portion of the convex portion 4B, and extends between the outer circumference of the susceptor 2 and the inner circumferential surface of the chamber body 12. In addition, the convex portion 4A has a bent portion 46A that bends in an L-shape from an outer circumferential portion of the convex portion 4A, and extends between the outer circumference of the susceptor 2 and the inner circumferential surface of the chamber body 12. Because the bent portions 46A, 46B have the same structure, the bent portion 46A is explained referring to FIGS. 1 and 2 in the following for the sake of convenience. As shown, the bent portion 46A is integrally formed with the convex portion 4A in this embodiment. The bent portion 46A substantially occupies the space between the susceptor 2 and the chamber body 12, thereby impeding the first reaction gas (e.g., BTBAS gas) from being intermixed with the second reaction gas (e.g., $O_3$ gas) by way of this space. Gaps between the chamber body 12 and the bent portion 46A, and between the bent portion 46A and the susceptor 2 may be the same as the height h1 of the ceiling surface 44 from the upper surface of the susceptor 2. Because of the bent portion 46A, the separation gas from the separation gas nozzle 41 (FIG. 1) is less likely to flow outward into the space between the susceptor 2 and the chamber body 12. Therefore, the bent portion 46A contributes to maintaining the higher pressure of the separation space H (the space between the susceptor 2 and the convex portion 4A). Incidentally, because a block member 71b is provided below the bent portion 46A (or 46B) in this embodiment, which is preferable in that the higher pressure of the separation space H can more effectively maintained.

Incidentally, the gap between the bent portions 46A, 46B and the susceptor 2 is preferably determined by taking into consideration thermal expansion of the susceptor 2 so that the gap becomes the same as, for example, the height h1 when the susceptor 2 is heated by the heater unit 7.

As shown in FIG. 2, a part of the inner circumferential surface of the chamber body 12 is indented outward in the first area 481, and an evacuation port 61 is formed below the indented portion. In addition, another part of the inner circumferential surface of the chamber body 12 is indented outward in the second area 482, and an evacuation port 62 is formed below the indented portion. The evacuation ports 61, 62 are connected together or separately to an evacuation system including a pressure controller and a turbo molecular pump (not shown), so that an inner pressure of the vacuum chamber 1 is controlled. Because the evacuation port 61 is formed corresponding to the first area 481, and the evacuation port 62 is formed corresponding to the second area 482, the first area 481 is evacuated substantially exclusively through the evacuation port 61 and the second area 482 is evacuated substantially exclusively through the evacuation port 62. Therefore, the pressures of the first area 481 and the second area 482 tend to be lower than the pressure of the separation space H. In addition, the evacuation port 61 is positioned between the reaction gas nozzle 31 and the convex portion 4B located downstream relative to the reaction gas nozzle 31 along the rotation direction of the susceptor 2. Additionally, the port 62 is positioned between the reaction gas nozzle 32 and the convex portion 4A located downstream relative to the reaction gas nozzle 32 along the rotation direction of the susceptor 2. Specifically, the evacuation port 62 comes closer to the convex portion 4A. With these configurations, the first reaction gas (e.g., BTBAS gas) is substantially exclusively evacuated through the evacuation port 61, and the reaction gas (e.g., $O_3$ gas) is substantially exclusively evacuated through the evacuation port 62. Namely, such arrangements of the evacuation ports 61, 62 contribute to separating the first reaction gas and the second reaction gas.

In addition, the film deposition apparatus 200 according to this embodiment is provided with a control portion 100 that controls total operations of the deposition apparatus, as shown in FIG. 2. The control portion 100 includes a process controller 100a formed of, for example, a computer, a user interface portion 100b, and a memory device 100c. The user interface portion 100b has a display that shows operations of the film deposition apparatus, and a key board and a touch panel (not shown) that allow an operator of the film deposition apparatus 200 to select a process recipe and an administrator of the film deposition apparatus to change parameters in the process recipe.

The memory device 100c stores a control program and a process recipe that cause the controlling portion 100 to carry out various operations of the deposition apparatus, and various parameters in the process recipe. These programs have groups of steps for carrying out a film deposition process described later, for example. These programs and process recipes are installed into and run by the process controller 100a by instructions from the user interface portion 100b. In addition, the programs are stored in a computer readable storage medium 100d and installed into the memory device 100c from the storage medium 100d through an interface (I/O) device (not shown) corresponding to the computer readable storage medium 100d. The computer readable storage medium 100d may be a hard disk, a compact disk, a compact disk readable/rewritable, a digital versatile disk readable/rewritable, a flexible disk, a semiconductor memory, or the like. Moreover, the programs may be downloaded to the memory device 100c through a communications network.

Advantages and effects of the film deposition apparatus 200 equipped with the substrate position detection apparatus 101 according to this embodiment of the present invention are understood from the following explanation about a substrate position detection method and a film deposition method.

(A Second Embodiment)

Next, a film deposition method according to a second embodiment of the present invention is explained with reference to FIG. 5 in addition to FIGS. 1 through 4. The film deposition method is preferably carried out using the film deposition apparatus 200 according to the first embodiment of the present invention, and includes a substrate position detection method.

Figure 5:
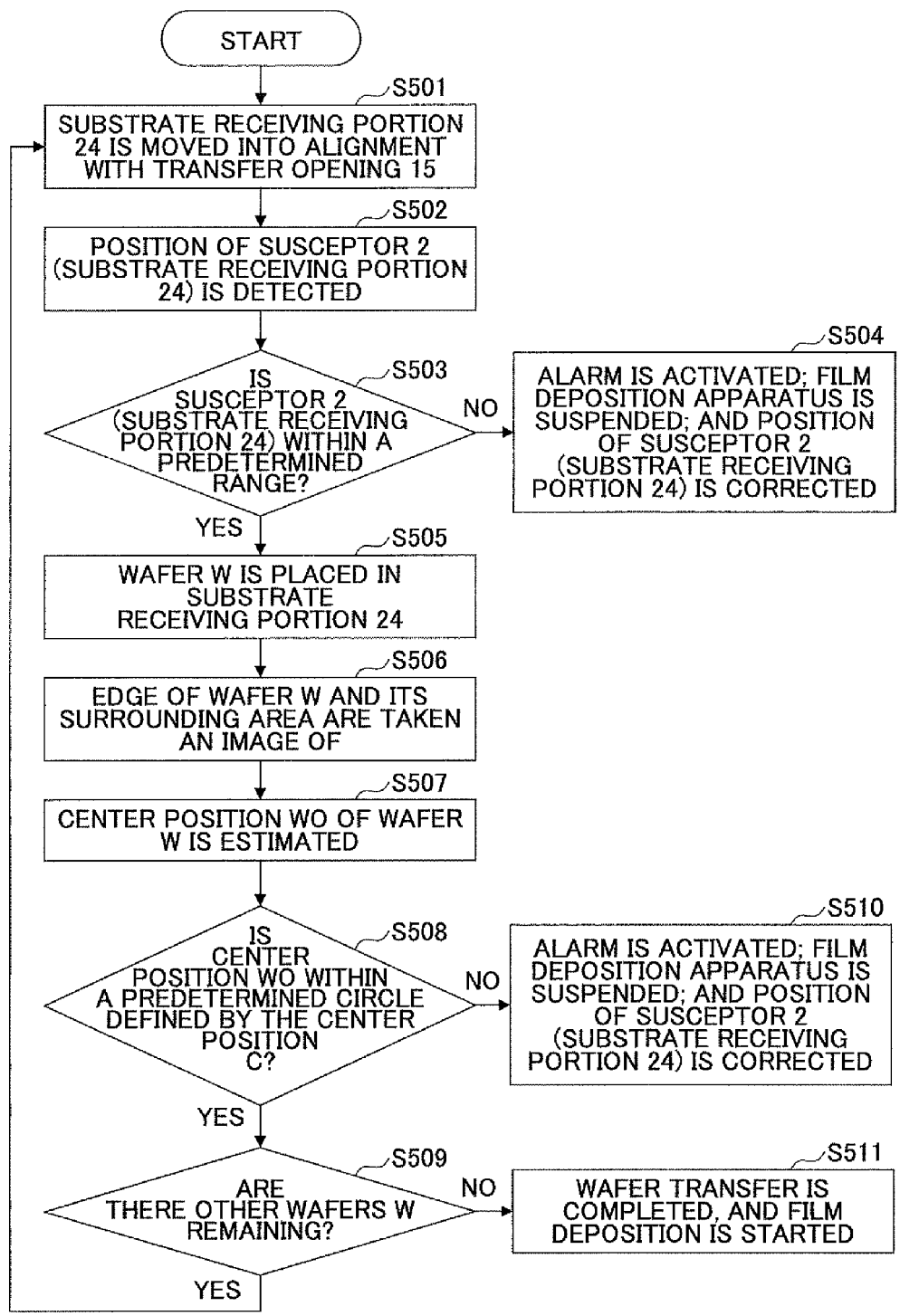
FIG. 5 is a flowchart for explaining a substrate position detection method according to a second embodiment of the present invention.

First, the susceptor 2 is rotated so that one of the five substrate receiving portions 24 is in alignment with the transfer opening 15 (Step S501 in FIG. 5).

Figure 6:
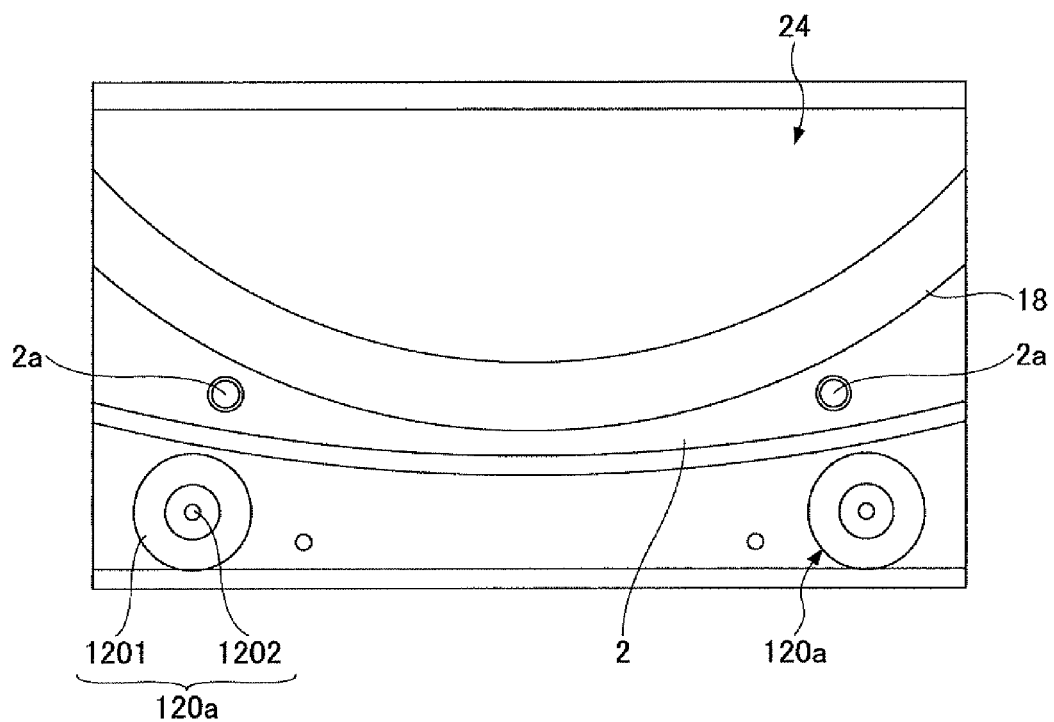
FIG. 6 is a schematic view depicting an image of an area including a circumferential area of the susceptor, which is taken by the substrate position detection apparatus according to the embodiment of the present invention.

Next, in Step S502, a position of the wafer receiving portions 24 is detected. Specifically, the light source 108 is turned on, so that the lower surface of the panel 106 is illuminated by the light source 108. Next, an image of an area including the circumferential edge of the susceptor 2, which is indirectly illuminated by the panel 106, is taken by the camera 104, and the image data are collected by the control portion 104a. An example of an image is illustrated in FIG. 6. As shown, the two susceptor marks 2a formed in the susceptor 2 and the two chamber marks 120a formed in the bottom of the chamber body 12 of the vacuum chamber are observed.

Figure 7:
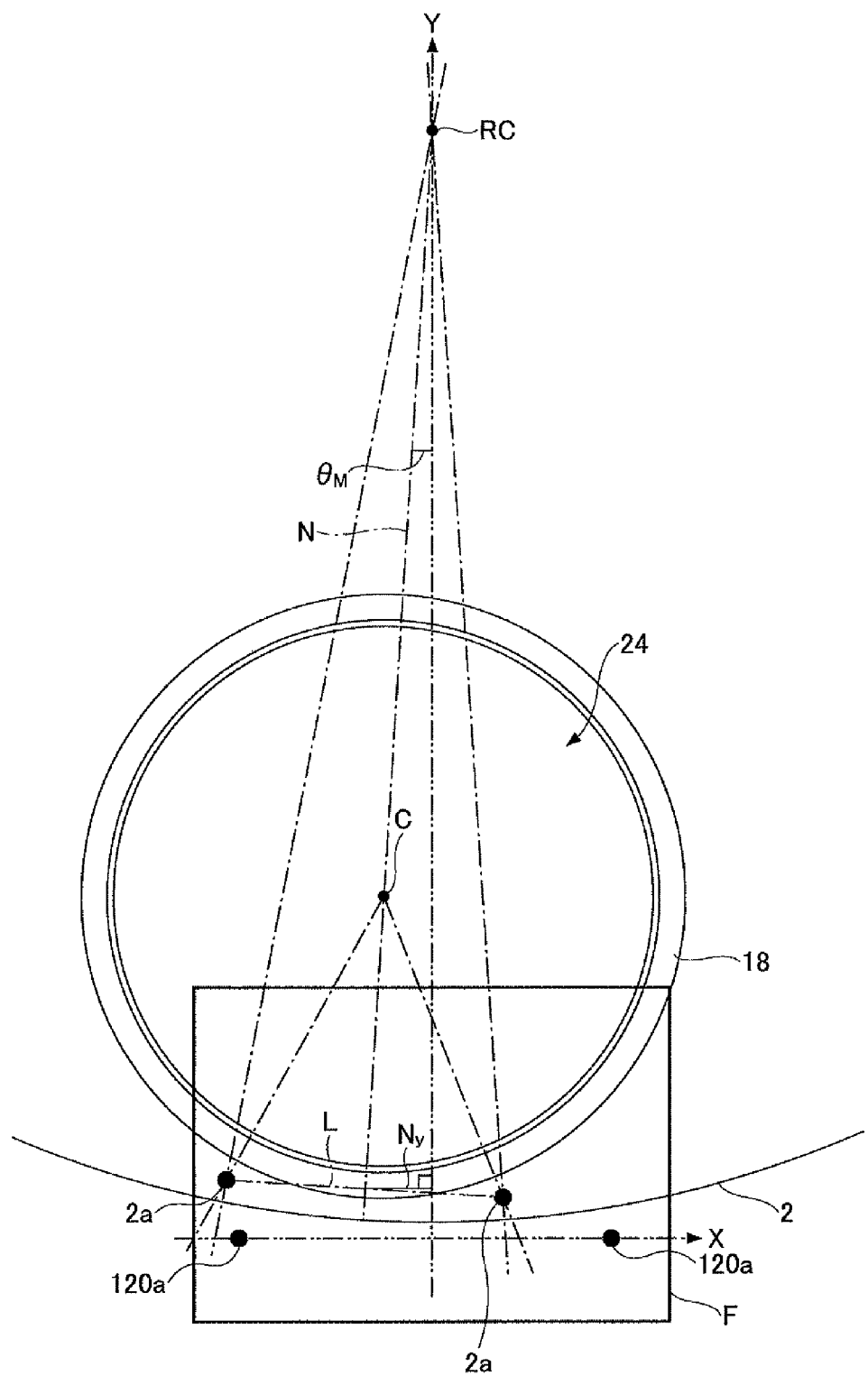
FIG. 7 is an explanatory view for explaining principal of detecting a position of the substrate receiving position in the susceptor.

The two susceptor marks 2a are arranged in symmetry with each other with respect to a straight line that passes through a center C of the substrate receiving portion 24 and the rotational center RC of the susceptor 2, as shown in FIG. 7. In other words, when a perpendicular line N is drawn from the rotational center RC to a line segment L that connects the centers of the corresponding susceptor marks 2a, the perpendicular line N passes through the center C of the substrate receiving portion 24 and intersects a middle point of the line L. (That is, the perpendicular line N is a perpendicular bisector of the line segment L.)

In addition, the two chamber marks 120a have been arranged so that a perpendicular bisector of a line segment that connects the two chamber marks 120a passes through the rotational center RC of the susceptor 2.

Assuming that the image taken by the camera 104 of the substrate position detection apparatus 101 is as shown in FIG. 7, an example of detecting a position deviation of the substrate receiving portion 24 is explained. FIG. 7 illustrates the substrate receiving portion 24 that is deviated from a desired position, for the sake of explanation. First, a pixel corresponding to one of the two chamber marks 120a and another pixel corresponding to the other one of the two chamber marks 120a are specified among pixels of the CCD camera 104. With this, a straight line X (X axis) that passes through the middle point of the two chamber marks 120a and a straight line Y (Y axis) are obtained on the pixels of the CCD camera 104, so that an X-Y coordinate is defined.

Next, a pixel corresponding to one of the two susceptor marks 2a and another pixel corresponding to the other one of the two susceptor marks 2a are specified among the pixels of the CCD camera 104. Based on these specified pixels, the perpendicular line N is specified. Then, a perpendicular line Ny drawn from an end point of the perpendicular line N (the opposite point of the rotational center RC of the susceptor 2) to the Y axis is specified, and a length of the perpendicular line Ny is obtained. Next, an angle $\theta_M(=\tan-1(Ny/N))$ defined by the perpendicular line Ny and the perpendicular line N is calculated from the length of the perpendicular line Ny and a length of the perpendicular line N. The lengths of the perpendicular lines Ny, N can be obtained from the number of pixels arranged along the corresponding perpendicular lines Ny, N using a conversion ratio (the number of pixels per unit length).

Subsequently, it is determined in Step S503 if the substrate receiving portion 24 is within a predetermined range. Specifically, it is determined if the angle $\theta_M$ is within a predetermined angular range. If the substrate receiving portion 24 is deviated beyond the predetermined range, the wafer W cannot be placed in the substrate receiving portion 24. In other words, the predetermined angular range is preferably determined taking into consideration an inner diameter of the substrate receiving portion 24 (e.g., about 304 mm through about 308 mm with respect to a wafer having a diameter of 300 mm (12 inches)). Incidentally, it may be determined if the line segment L is within a predetermined length in order to determine if the wafer W is within a predetermined range. Alternatively, it may be determined if the line segment L is parallel with the X axis (or if deviation from being parallel with the X axis is within a predetermined range). Moreover, the position of the wafer W may be determined by determining if an angle defined by the Y axis and a line segment that connects the susceptor mark 2a with the rotational center RC.

In addition, the position of the substrate receiving portion 24 may be determined by determining how far a middle point of the two susceptor marks 2a is away from the perpendicular line N (the Y axis), which is the perpendicular bisector of the line segment connecting the two chamber marks 120a.

As a determination result, when the substrate receiving portion 24 is not within the predetermined range (Step S503: NO), the control portion 104a of the substrate position detection apparatus 101 outputs an alarm signal indicating to the effect, and/or outputs a signal indicating that the film deposition apparatus 200 should be suspended to the film deposition apparatus 200. In response to this, an operator of the film deposition apparatus 200 may correct the position of the substrate receiving portion 24. In addition, the position of the substrate receiving portion 24 may be corrected by causing the driving portion 23 of the film deposition apparatus 200 to rotate the susceptor 2.

When it is determined in Step S505 that the substrate receiving portion 24 is within the predetermined range, the wafer W is placed in the substrate receiving portion 24. Specifically, the wafer W is transferred into the vacuum chamber 1 by the transfer arm 10A (see FIG. 2), and placed down in the substrate receiving portion 24 from the transfer arm 10A by the pusher 2P moved by the lift pins 16a.

Next, in Step S506, an area including an edge of the wafer W and its vicinity of the susceptor 2, which are indirectly illuminated by the panel 106, are taken an image of by the camera 104 of the film position detection apparatus 101, and image data are collected by the control portion 104a. An example of the image taken by the camera 104 is illustrated in FIG. 8. As shown, the wafer W appears uniformly white, and the susceptor 2 made of carbon appears black. Incidentally, a black rectangle K that exists in the wafer W in FIG. 8 is the opening 106b of the panel 106, which is reflected by the wafer W.

Figure 9:
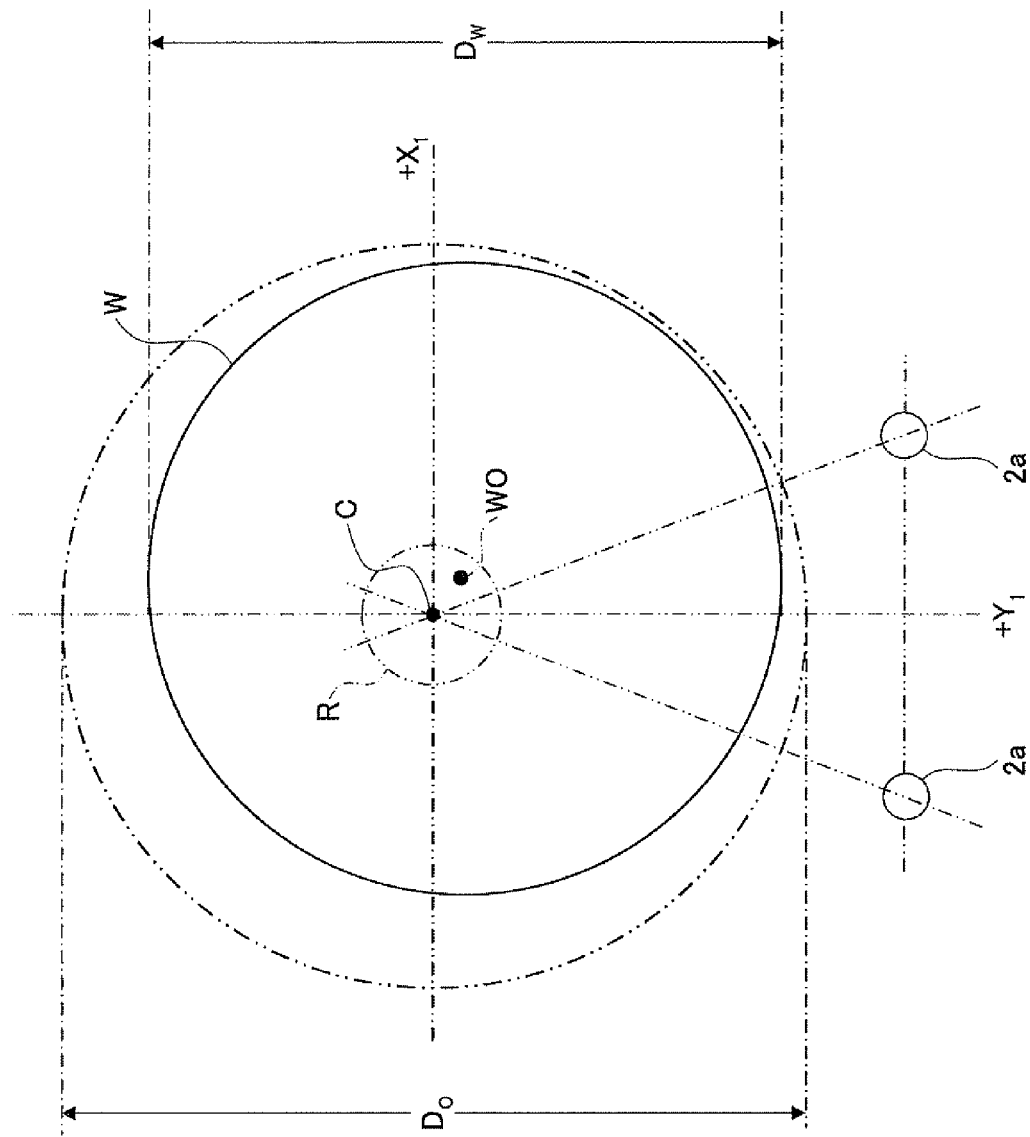
FIG. 9 is an explanatory view for explaining principal of detecting a position of the substrate placed in the substrate receiving portion of the susceptor.

Next, the control portion 104a detects the edge line of the wafer W in the image obtained by the camera 104. This detection may be carried out by using the edge detecting function prepared in advance in control part 104a. Next, the position of the center WO of the wafer W (FIG. 9) is estimated by obtaining a point (or coordinates) through which plural lines perpendicular to corresponding tangential lines at the edge line (step S507).

Next, a distance d between the estimated position of the center WO of the wafer W and the position of the center C of the substrate receiving portion 24 is obtained. Here, assuming that the center C of the substrate receiving portion 24 is in a point $(X_C, Y_C)$, and the center WO of the wafer W is in a point $(X_W, Y_W)$ in the $X_1$-$Y_1$ coordinates shown in FIG. 9, a following relationship is held.

$$d^2=((X_W-X_C)^2+(Y_W-Y_C)^2)/CF^2 \quad (1)$$

In the expression (1), CF is a conversion factor that indicates a ratio of an actual distance in relation to a distance between pixels of CCD, for example. Moreover, the center C of the substrate receiving portion 24 can be specified based on the position of the two susceptor marks 2a obtained in Step S502. In the line segment N, the distance from the center C of the substrate receiving portion 24 to the rotational center RC of the substrate receiving portion 24 is known in advance.

Then, it is determined if the wafer W is within a predetermined range by using the distance d obtained based on the expression (1) (step S508). For example, assuming that the substrate receiving portion is formed as the concave portion and its inner diameter is D0 mm, with respect to the wafer W having a diameter of Dw mm, when the following relationships are held, $$0 \leq d^2 \leq l^2 \quad (2)$$

$$L=(D_0-D_w)/2 \quad (3)$$

the center WO of the wafer W comes to enter within the circle R having a radius l whose center corresponds to the center C of the substrate receiving portion 24. Namely, it is determined that the wafer W falls within the substrate receiving portion 24, and thus it is determined that the position of the wafer W is within the predetermined range.

When the distance d is within the predetermined range (Step S508: YES), a query signal about whether all the wafers W have been transferred into the vacuum chamber (or placed in the corresponding substrate receiving portions 24) is output from the control portion 104a to the film deposition apparatus 200 (Step S509). When information indicating that there remains a wafer W to be transferred, the procedure goes back to Step S501. Namely, the susceptor 2 of the film deposition apparatus 200 is rotated, and the next substrate receiving portion 24 is moved to the image taking position. Then, the above series of the procedures is carried out with respect to the wafer W concerned and the substrate receiving portion 24 in which the wafer W is to be placed.

Moreover, when it is determined that the distance d is not within the predetermined range (step S508: NO), the alarm is activated by the control portion 104a, and the signal requesting the suspension of the operations in the film deposition apparatus 200 is output from the control portion 104a to the film deposition apparatus 200 (Step S510), which makes the film deposition apparatus 200 become in a stand-by state. In this case, manual recovering operations are carried out by the operator of the film deposition apparatus 200 in accordance with predetermined procedures, so that the wafer W is placed within the predetermined range.

When it is determined that there are no wafers W to be transferred, namely, all the five wafers W are placed in the corresponding substrate receiving portions 24 (Step S509: NO), the film deposition is begun in the film deposition apparatus 200 (Step S511).

Specifically, the vacuum chamber 1 is evacuated by an evacuation system (not shown); the $N_2$ gases are supplied to the vacuum chamber 1 from the separation gas nozzle 41, 42, the separation gas supplying pipe 51, and the purge gas supplying pipes 72, 73; and the inside of the vacuum chamber 1 is maintained at a predetermined pressure by a pressure controller (not shown). Next, the susceptor 2 starts rotating clockwise when seen from above. The susceptor 2 is heated to a predetermined temperature (e.g., 300° C.) in advance by the heater unit 7, which in turn heats the wafers W on the susceptor 2. After the wafers W are heated and maintained at the predetermined temperature, the BTBAS gas is supplied to the first area 481 through the reaction gas nozzle 31, and the $O_3$ gas is supplied to the second area 482 through the reaction gas nozzle 32.

When the wafer W passes through an area below the reaction gas nozzle 31, BTBAS molecules are adsorbed on the surface of the wafer W, and when the wafer W passes through an area below the reaction gas nozzle 32, $O_3$ molecules are adsorbed on the surface of the wafer W, so that the BTBAS molecules are oxidized by the $O_3$ molecules. Therefore, when the wafer W passes through the areas 481, 482 with one rotation of the susceptor 2, one (or more) molecular layer(s) of silicon oxide is formed on the surface of the wafer W. Then, the wafer W alternately passes through the areas 481, 482 plural times, and a silicon dioxide layer having a predetermined thickness is formed on the surfaces of the wafers W. After the silicon dioxide film having the predetermined thickness is deposited, the supply of the BTBAS gas and the supply of the $O_3$ gas are stopped, and the rotation of the susceptor 2 is stopped. Then, the wafers W are transferred out from the vacuum chamber 1 in procedures opposite to the procedures taken when transferring the wafers W into the vacuum chamber 1, and the film deposition process is completed.

According to the film deposition method including the substrate position detection method according to the embodiment of the present invention, the X-Y coordinates are defined by the two chamber marks 120A formed in the bottom of the chamber body 12, and the position of the substrate receiving position 24 is detected based on an angular deviation that can be obtained with respect to the X-Y coordinates from the two susceptor marks 2a formed in the susceptor 2. Because the X-Y coordinates defined by the two chamber marks 120a are used as reference, the substrate position detection apparatus 101 (or the camera 104) is not necessarily positioned with high positional accuracy with respect to the film deposition apparatus 200. In other words, the substrate position detection apparatus 101 can only be positioned so that the susceptor marks 2a, the chamber marks 120a, and the edge area of the susceptor 2 are observed by the camera 104. Therefore, it is not need to adjust the position of the substrate position detection apparatus 101 with respect to the film deposition apparatus 200 taking a long time after maintenance or the like is carried out, which increases usage efficiency of the film deposition apparatus 200.

In addition, because the substrate receiving portion 24 is detected by using the two chamber marks 120a and the two susceptor marks 2a, the positional deviation is obtained in terms of an angle. When the driving portion 23 is configured of, for example, a pulse motor, the position of the substrate receiving portion 24 can be corrected by supplying the number of pulses determined based on the angle $\theta_M$ obtained in Step S592 to the pulse motor. However, the position is detected based on the length of the perpendicular line Ny (namely, a deviation in terms of a length) instead of the angle $\theta_M$.

In addition, according to the substrate position detection apparatus 101, the wafer W appears uniformly white. This is because the panel 106 is made of an acrylic plate painted with white pigment and has a milky white color. Namely, when the lower surface (facing the wafer W) of the panel 106 is illuminated by the light source 108, the panel 106 emanates white light substantially entirely and uniformly. In this case, because the wafer W below the panel 106 is illuminated by the emanating panel 106, or such a panel 106 is reflected by the mirror surface of the wafer W, the wafer W appears entirely and uniformly white. Therefore, the wafer W appears white, including the edge, in the image taken by the camera 104. On the contrary, the susceptor 2 on which the wafer W is placed is usually made of carbon or silicon carbide (SiC), and thus appears black even when the susceptor 2 is illuminated by the panel 106 emanating white light. Therefore, relatively strong contrast is caused between the wafer W and the susceptor 2 in the image, which contributes to accurate edge recognition and thus the estimation of the wafer center WO of the wafer W. In addition, because the light from the panel 106 reaches the wafer W and the susceptor 2 from every direction, shade is less likely to be caused by the wafer W and the substrate receiving portion 24 of the susceptor 2. As a whole, the edge of the wafer W is clearly recognized, thereby reducing detection errors.

Moreover, because the panel 106 emanates entirely and uniformly, the intense reflection is not caused from the edge (bevel portion) of the wafer W, thereby reducing detection errors caused by such reflection. Furthermore, because no intense reflection is caused from the mirror surface of the wafer W, an optical flare is not created in the camera 104, thereby enabling accurate recognition of the edge of the wafer W.

(A Third Embodiment)

Next, a substrate position detection method according to a third embodiment is explained with reference to FIGS. 11 through 15. The substrate position detection method of this embodiment can be replaced with the substrate position detection method in the film deposition method according the second embodiment, and carried out as part of the film deposition method.

Figure 11:
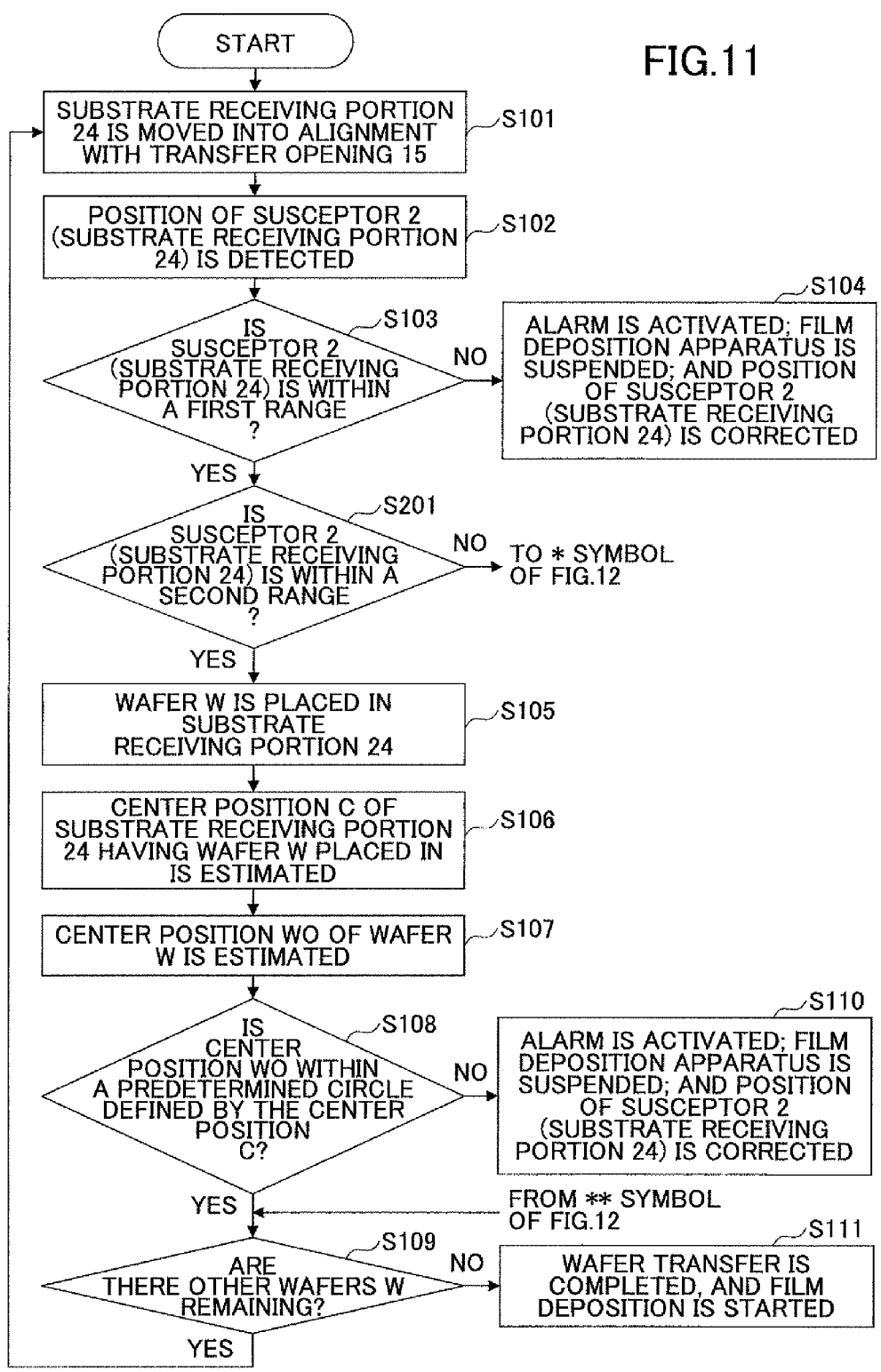
FIG. 11 is a flowchart for explaining a substrate position detection apparatus according to a third embodiment of the present invention.

As shown in FIG. 11, Steps S101 and S102 in the substrate position detection method according to this embodiment are the same as Steps S501 and S502, respectively, in the second embodiment. Therefore, repetitive explanation about the steps is omitted.

In Step S103, it is determined if the substrate receiving portion 24 is within a first range. Here, the first range may be a range where the lift pins 16a (FIG. 3) can support the pusher 2P, for example. When it is determined that the substrate receiving portion 24 is not within the first range (Step S103: NO), the control portion 104a of the substrate position detection apparatus 101 outputs an alarm signal, and/or outputs a signal indicating that the film deposition apparatus 200 should be suspended to the film deposition apparatus 200. In response to this in Step S104, an operator of the film deposition apparatus 200 may correct the position of the substrate receiving portion 24. In addition, the position of the substrate receiving portion 24 may be corrected by causing the driving portion 23 of the film deposition apparatus 200 to rotate the susceptor 2.

When it is determined that the substrate receiving portion 24 is within the first range (Step S103: YES), it is determined if the substrate receiving portion 24 is within a second range that is set to be narrower than the first range (Step S201). When it is determined that the substrate receiving portion 24 is within the second range (Step S201: YES), Steps S105 through S111 are carried out subsequently. Steps S105 through S111 are the same as Steps S505 through S511 explained with reference to FIG. 5, respectively. Therefore, repetitive explanations are omitted.

Figure 12:
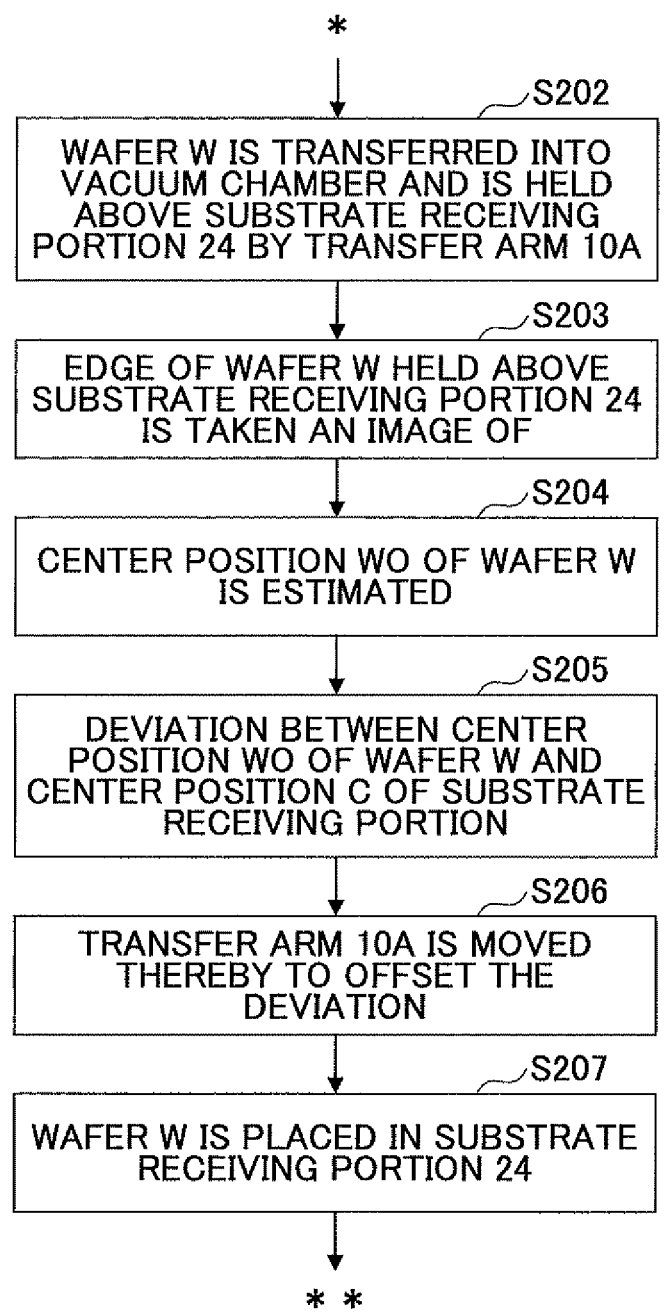
FIG. 12 is a flowchart for explaining a substrate position detection apparatus according to a third embodiment of the present invention, following FIG. 11.

When it is determined that the substrate detecting portion 24 is not within the second range (FIG. 12, Step S201: NO), the transfer arm 10A with the wafer W is moved into the vacuum chamber 1 (FIG. 2), and the wafer W is held above the substrate receiving portion 24 by the transfer arm 10A (Step S202). Next, in Step S202, the wafer W held above the substrate receiving portion 24 is taken an image of by the substrate position detection apparatus 101 (the camera 104). Then, the center position WO of the wafer W is estimated in substantially the same manner as in Step S507 (FIG. 5). However, in this case, because the wafer W is held at a position hw that is higher than the bottom surface of the substrate receiving portion 24, while the wafer W is placed in the substrate receiving portion 24 in Steps S506 and S507, a height correction needs to be carried out in order to estimate the center position WO of the wafer W that is to be placed in the substrate receiving portion 24, in Steps S203 and S203. If the height correction is not carried out, the edge of the wafer W is recognized to exist at a point E in FIG. 14. Therefore, estimation errors of the center position WO of the wafer W are caused when estimating the center position WO.

Figure 13:
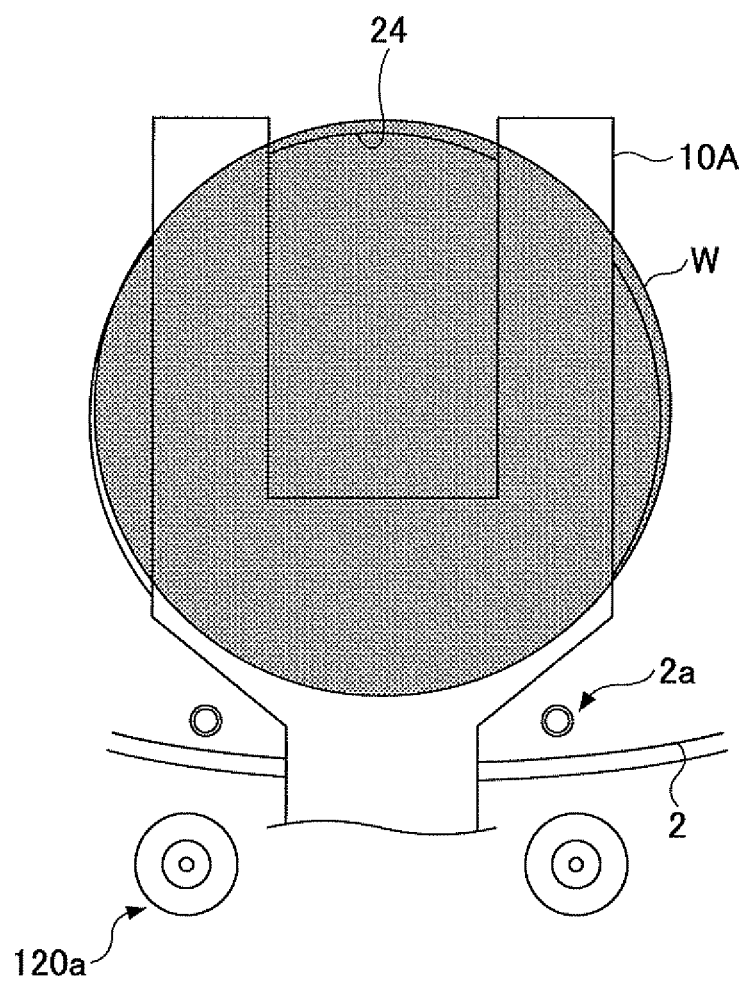
FIG. 13 is a schematic plan view illustrating a substrate held above the substrate receiving portion by a transfer arm.
Figure 14:
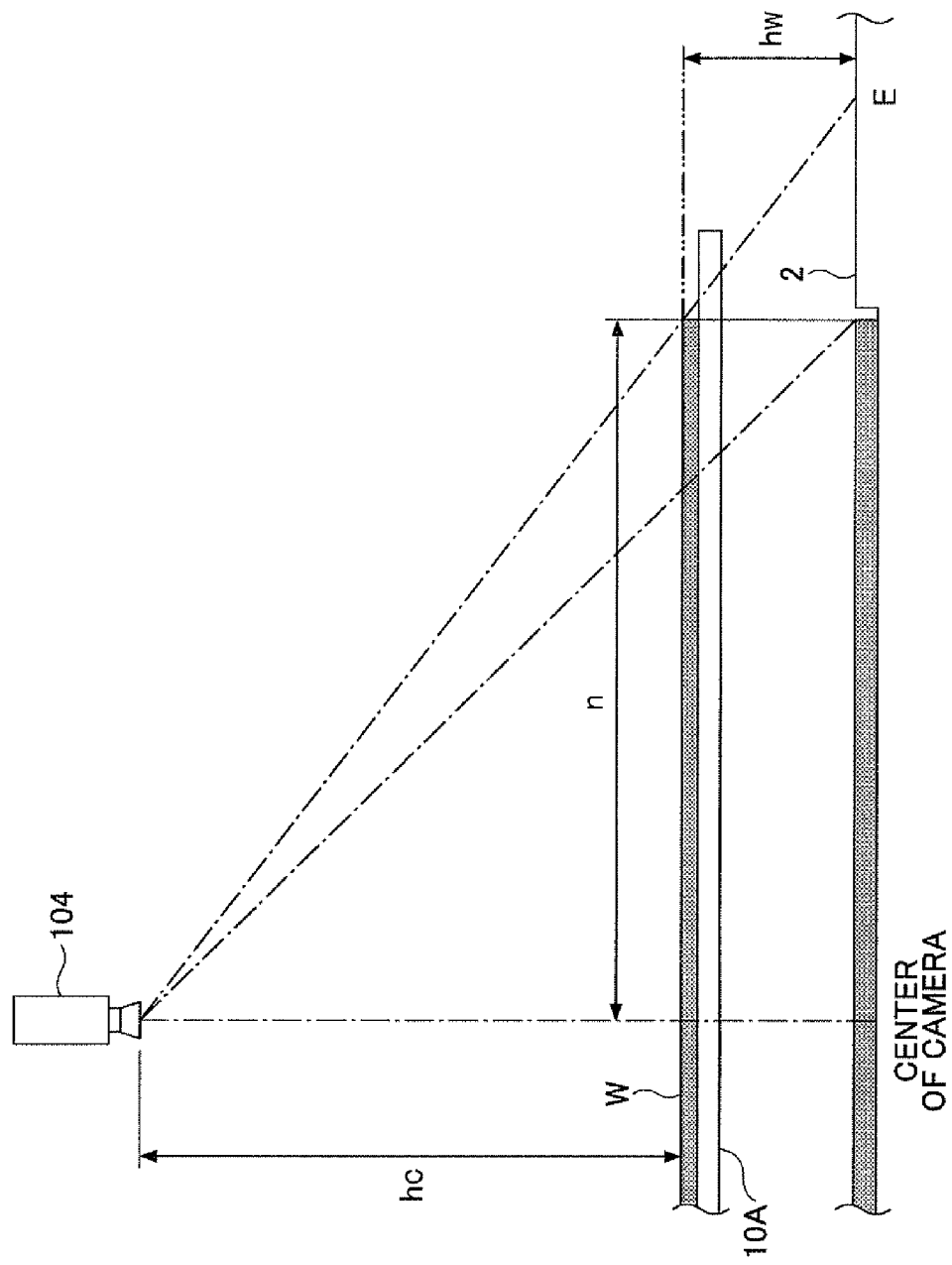
FIG. 14 illustrates a positional relationship among the substrate held above the substrate receiving portion by the transfer arm, the substrate receiving portion, and an image taking portion.
Figure 15:
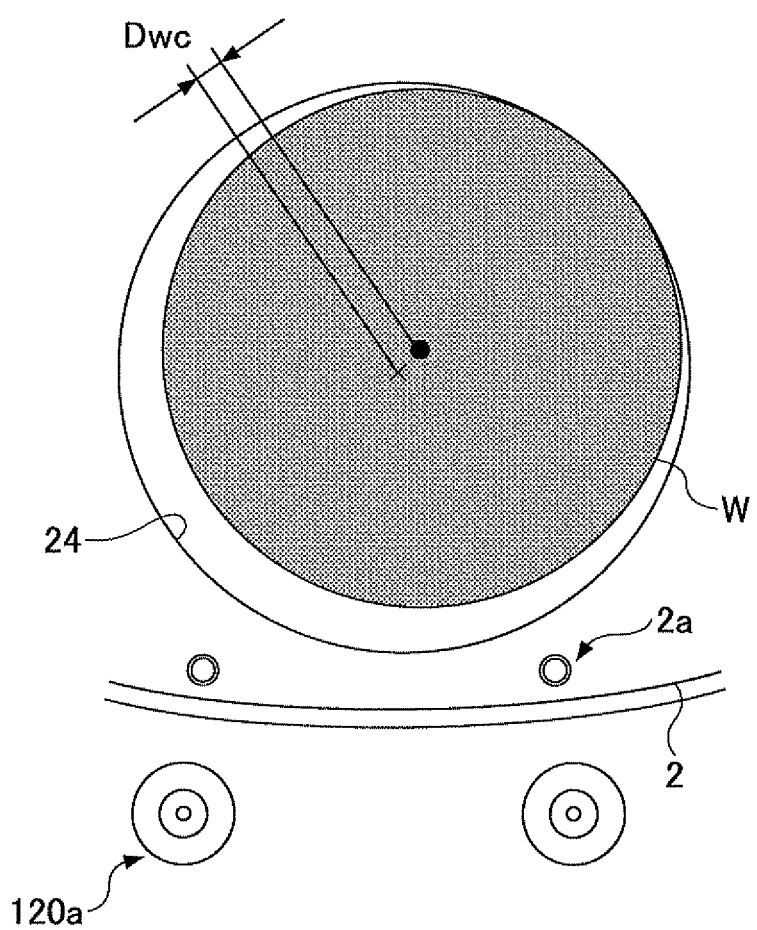
FIG. 15 is a schematic view illustrating deviation between a center position of the substrate and a center of the substrate receiving portion.

Specifically, a first pixel corresponding to a point right below the center of the camera 104 is specified from the pixels of the camera 104, and a second pixel corresponding to a point in the edge of the wafer W is specified from the pixels of the camera 104 (see FIG. 14). Next, a distance between the first pixel and the second pixel is obtained. Then, an actual distance n on the wafer W, which corresponds to the pixel distance between the first pixel and the second pixel, is obtained by converting the pixel distance by way of a conversion factor. The conversion factor is a ratio of an actual unit length on the wafer W positioned at the height of hw (known) with respect to a unit length between pixels on the CCD of the camera 104. Because the actual distance n is identical regardless of a height of the wafer W as shown in FIG. 13, a point that is away by the actual distance n from the point right below the center of the camera 104 in the wafer W placed in the substrate receiving portion 24 can be obtained through calculation using the conversion factor CF. In such a manner, the edge position of the wafer W placed in the substrate receiving portion 24 can be obtained from the edge position of the wafer W held above the substrate receiving portion 24.

In addition, the edge position of the wafer W placed in the substrate receiving portion 24 can be obtained in the following manner. First, the wafer W held by the transfer arm 10A is vertically moved by using the lift pins 16a and the pusher 2P by a height distance of Δhw (Δhw<hw), and a shifting distance of a pixel corresponding to an arbitrary edge position of the wafer W with respect to the height distance Δhw is measured. Then, a pixel corresponding to the edge position of the wafer W placed in the substrate receiving portion 24 can be estimated from the pixel corresponding to the edge position of the wafer W held above the substrate receiving portion 24 in accordance with the shifting distance with respect to the height distance.

Then, the edge detection is carried out based on the edge positions of the wafer W in the substrate receiving portion 24, which are obtained by the height correction. Incidentally, plural edge positions are obtained in the same manner, although only one edge position is obtained in the above explanation. Therefore, the center position WO of the wafer W in the substrate receiving portion is obtained (Step S204). Next, deviation Dwc (see FIG. 15) between the center position WO and the center C of the substrate receiving portion 24 is obtained (Step S205). Here, the center C of the substrate receiving portion 24 can be obtained based on the image taken in Step S102. Subsequently, a position of the transfer 10A is corrected in order to offset the deviation Dwc.

Incidentally, as shown in FIG. 2, the transfer arm 10A is provided with an X direction driving unit 10X that moves the transfer arm 10A in an X-axis direction (see FIGS. 7 and 8), and with a Y direction driving unit 10Y that moves the transfer arm 10A in a Y-axis direction (see FIGS. 7 and 8). When the transfer arm 10A is moved by ΔX by the X direction driving unit 10X and by ΔY by the Y direction driving unit 10Y, assuming that the deviation Dwc is expressed by Dwc(ΔX, ΔY), so that a position of the transfer arm 10A is corrected. In addition, each of the X direction driving unit 10X and the Y direction driving unit 10Y may have, for example, a motor, an encoder, and a pulse counter (not shown), and with these, the transfer arm 10A can be moved by ΔX and ΔY, respectively. The estimation of the center position WO of the wafer W, calculation of the deviation Dwc, driving the transfer arm 10A, and the like are carried out under control of the control portion 100.

Next, the wafer W is transferred from the transfer arm 10A to the pusher 2P (FIG. 3), and then is placed in the substrate receiving portion 24 (FIG. 11: Step S109). When there are remaining wafers W (Step S109: YES), the procedure goes back to Step S101. Namely, the susceptor 2 of the film deposition apparatus 200 is rotated, and thus the next substrate receiving portion 24 comes into alignment with the transfer opening 15. Then, the series of the procedures is repeated with respect to this substrate receiving portion 24 and this wafer W. On the other hand, when there is no wafer W left, namely, when it is determined that there are no remaining wafers W (Step S109: NO), the film deposition is started in the film deposition apparatus 200.

According to this embodiment, when the substrate receiving portion 24 is within the first range but not within the second range (Step S201: NO), the center position WO of the wafer W at the time when the wafer W is placed in the substrate receiving portion 24 can be estimated in accordance with the obtained center position WO of the wafer W that is held above the substrate receiving portion 24 by the transfer arm 10A. Next, the deviation between the center C of the substrate receiving portion 24 and the center position WO of the wafer W is obtained, and the position of the transfer arm 10A is corrected based on the deviation. Then, the wafer W is placed in the substrate receiving portion 24. Because the position of the wafer W is corrected by the transfer arm 10A so that the center position WO of the wafer W is in agreement with the center C of the substrate receiving portion 24, the wafer W can be placed in the substrate receiving portion 24 with high accuracy.

Depending on the rotational speed of the susceptor 2, flow rates of the reaction gases and the separation gases, and an inner pressure of the vacuum chamber 1 at the time of film deposition, gas flow turbulence or gas stagnation may be caused in a gap between the inner circumferential wall of the substrate receiving portion 24, which is the concave portion in this embodiment, and the edge of the wafer W placed in the substrate receiving portion 24. Such gas flow turbulence or gas stagnation may cause a film thickness change or film properties change especially in a circumferential edge area of the wafer W. In order to avoid such problems, the inner diameter of the substrate receiving portion 24 is preferably set as close to as the diameter of the wafer W, for example, to be about 303 mm to about 305 mm.

In this case, because the edge of the wafer W comes close to the inner circumferential wall of the substrate receiving portion 24, the edge detection errors may take place with slightly high frequency even when the wafer W is indirectly illuminated by the panel 106 (FIG. 1). If such errors take place, it becomes difficult to place the wafer W in the substrate receiving portion 24 with high accuracy, so that the wafer W may be placed out from the substrate receiving portion 24, or slanted. When this happens, it takes a long time to correct the position of the wafer W. However, this embodiment is advantageous when a difference between the inner diameter of the substrate receiving portion 24 and the diameter of the wafer W is small, because the wafer W is placed in the substrate receiving portion 24 with high accuracy.

In addition, because the position of the transfer arm 10A and thus the wafer W is corrected before the wafer W is placed in the substrate receiving portion 24, position of the wafer W in the substrate receiving portion 24 needs not to be detected after the wafer W is placed in the substrate receiving portion 24.

While the present invention has been described with reference to the foregoing embodiments, the present invention is not limited to the disclosed embodiments, but may be modified or altered within the scope of the accompanying claims.

For example, the substrate position detection apparatus according to an embodiment of the present invention may be provided in other film deposition apparatus of, for example, a single wafer type, while being provided in the film deposition apparatus 200 serving as the ALD apparatus in the above embodiment. In addition, the substrate position detection apparatus according to an embodiment of the present invention may be provided in various semiconductor manufacturing apparatuses including an etching apparatus, a sputter apparatus, and the like.

In addition, when the position of the substrate receiving portion 24 is detected (Step S502), the light source 108 of the substrate position detection apparatus 101 may be directed toward the susceptor 2 and directly illuminate the susceptor 2. In this case, because there is no wafer W placed in the substrate receiving portion 24, no light is reflected from the wafer W. Therefore, the direct illumination by the light source 108 makes it easier to detect the susceptor marks 2a.

Figure 10:
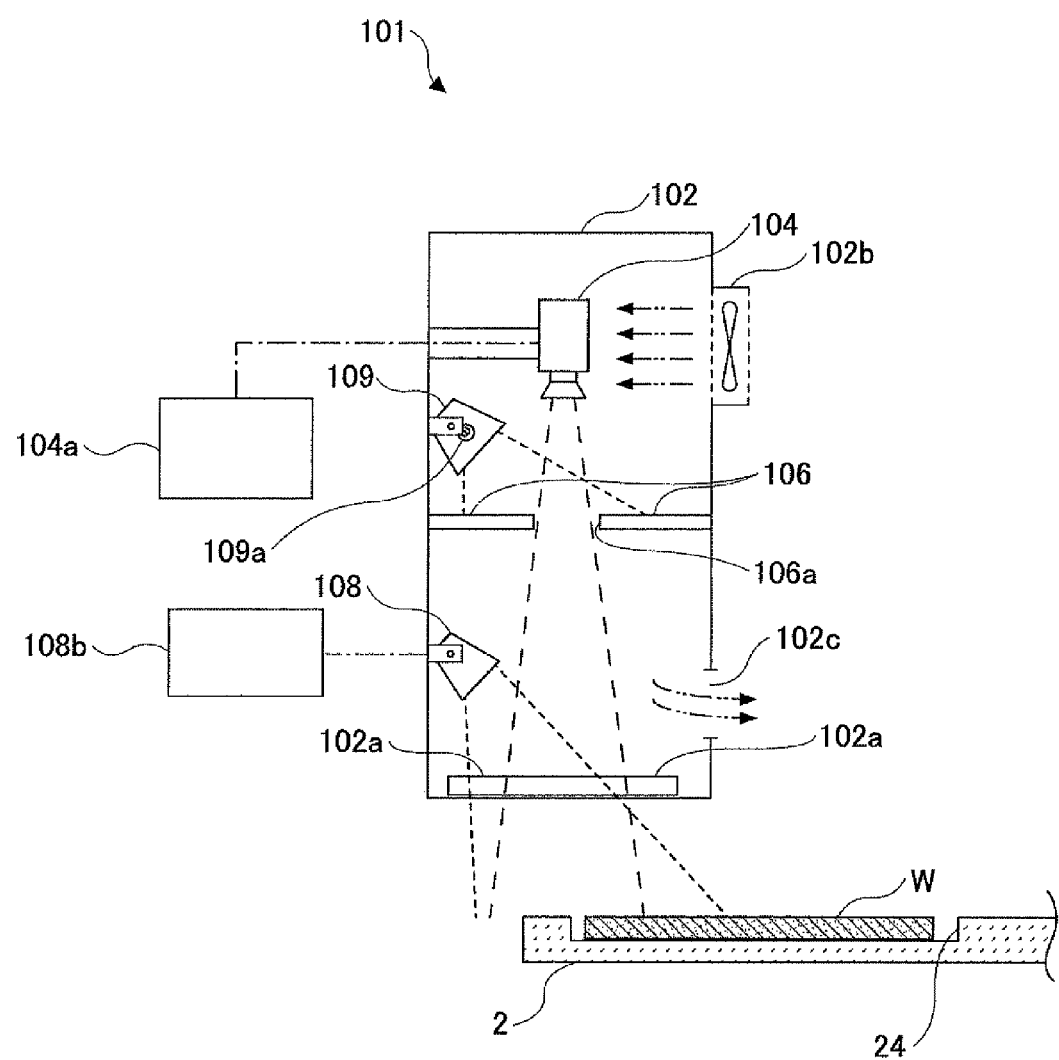
FIG. 10 is a cross-sectional view schematically illustrating an altered example of the substrate position detection apparatus.

While the light source 108 is placed between the panel 106 and the window 102a in the above embodiments, a light source 109 may be attached above the panel 106 on the inner wall of the chassis 102, to illuminate an upper surface (a surface facing the camera 104) of the panel 106, as shown in FIG. 10. The light source 109 may include a white LED in the same manner as the light source 108. Even in this case, because the panel 106 has light scattering properties, the light illuminating the upper surface of the panel 106 is scattered in various ways when transmitting through the panel 106, which is accompanied with multiple reflection caused between the upper and the lower surfaces of the panel 106, thereby allowing the entire panel 106 to appear uniformly bright. Therefore, the same advantages obtained by the substrate position detection apparatus 101 are obtained by the substrate position detection apparatus 101 shown in FIG. 6. Incidentally, the light source 109 may be provided in addition to the light source 108 provided between the panel 106 and the window 102a. In this case, the light source 108 can be used to directly illuminate the wafer W on the susceptor 2 when detecting the position of the susceptor 2 (or the substrate receiving portion 24).

While the panel 106 is made of an acrylic plate painted with white pigment and has a milky white color in the above embodiments, the panel 106 may be made of various materials, not being limited to acryl, as long as the panel 106 allows the wafer W to appear uniformly bright. For example, the panel 106 may be made of resins containing light scattering particles such as silica particles, silicon particles, and the like, or a resin plate or a glass plate having a roughened surface. In addition, the panel 106 may be once made of a transparent resin or glass plate and then one or both surface(s) may be roughened. In this case, roughening may be carried out by sandblasting, mechanical grinding using a grind stone or the like, or etching. Moreover, the panel 106 may be made of a resin or glass plate having plural micro-array lenses on one or both surface(s).

In addition, the panel 106 does not necessarily have a shape of a flat plate, but may have a shape of a dome, a cone, a truncated pyramid (inverted or not), or the like, as long as the panel 106 has an opening that allows the camera 104 to take an image of the edge of the wafer W and its surrounding area.

Moreover, the third embodiment may be modified in the following manner. When it is determined that the substrate receiving portion 24 is within the first range (Step S103: YES), the procedure may proceed to Step S201 without determining if the substrate receiving portion 24 is within the second range. Then, after Step S207, the procedure may go back to Step S109. With this, the wafer W can be placed in the substrate receiving portion 24 with high accuracy because of the positional correction of the transfer arm 10A.

The film deposition apparatus 200 according to an embodiment of the present invention can be applicable to ALD of a silicon nitride film. In addition, ALDs of aluminum oxide ($Al_2O_3$) using trimethyl aluminum and $O_3$ gases, zirconium oxide ($ZrO_2$) using tetrakis-ethyl-methyl-amino-zirconium (TEMAZ) and $O_3$ gases, hafnium oxide ($HfO_2$) using tetrakis-ethyl-methyl-amino-hafnium (TEMAH) and $O_3$ gases, strontium oxide using bis(tetra methyl heptandionate) strontium ($Sr(THD)_2$) and $O_3$ gases, titanium oxide ($TiO_2$) using (methyl-pentadionate)(bis-tetra-methyl-heptandionate) titanium (Ti(MPD)(THD)) and $O_3$ gases can be carried out in the film deposition apparatus 200. In addition, oxygen plasma can be used instead of the $O_3$ gas. Even when these gases are used, the above effects and advantages are provided.

What is claimed is:

1. A substrate position detection method carried out in a semiconductor fabrication apparatus provided with a process chamber where a predetermined process is carried out with respect to a substrate, and a susceptor that is rotatably housed in the process chamber and has a substrate receiving portion in which the substrate subject to a position detection is placed, the substrate position detection method comprising the steps of:

rotating the susceptor so that the substrate receiving portion is moved into an image taking area of a imaging apparatus;

detecting first two position detection marks provided in the process chamber so that the first two position detection marks are within the image taking area, wherein a first perpendicular bisector of the first two position detection marks passes through a rotational center of the susceptor;

detecting second two position detection marks provided in the susceptor so that the second two position detection marks can be within the image taking area, wherein a second perpendicular bisector of the second two position detection marks passes through the rotational center of the susceptor and a center of the substrate receiving portion; and determining whether the substrate receiving portion is positioned in a predetermined range in accordance with the detected first two position detection marks and the detected second two position detection marks.

2. The substrate position detection method of claim 1, wherein the first perpendicular bisector is specified in the step of detecting the first two position detection marks, wherein the second perpendicular bisector is specified in the step of detecting the second two position detection marks, and wherein the substrate receiving portion is positioned in a predetermined range in accordance with an angle defined by the first perpendicular bisector and the second perpendicular bisector in the determining step.

3. The substrate position detection method of claim 1, further comprising:

when it is determined that the substrate receiving portion is within the predetermined range in the determining step, placing the substrate in the substrate receiving portion;

taking an image of an area including the substrate placed in the substrate receiving portion and the substrate receiving portion;

estimating a position of the substrate in accordance with the image of the area;

determining whether the substrate is positioned in a predetermined position in accordance with the estimated position of the substrate and a position of the substrate receiving portion obtained from the detected two position detection mark.

4. The substrate position detection method of claim 3, further comprising:

illuminating light to a panel member that is provided above the substrate in the substrate receiving portion and includes an opening, the panel member having a light scattering property, and taking an image of the area including the substrate placed in the substrate receiving portion and the substrate receiving portion through the opening, the area being illuminated by the panel member illuminated with the light.

5. The substrate position detection method of claim 1, wherein an alarm signal is output from the substrate position detection apparatus when it is determined that the substrate receiving portion is not within a predetermined range.

6. The substrate position detection method of claim 3, wherein the step of estimating the position of the substrate includes estimating recognition of an edge of the substrate placed in the substrate receiving portion.

7. The substrate position detection method of claim 1, further comprising:

when it is determined that the substrate receiving portion is within the predetermined range in the determining step, estimating a center position of the substrate receiving portion;

holding the substrate above the substrate receiving portion by way of a substrate transfer member that transfers the substrate;

taking an image of an area including the substrate held above the substrate receiving portion;

estimating a center position of the substrate at the time when the substrate is placed in the substrate receiving portion, in accordance with the taken image of the area including the substrate held above the substrate receiving portion;

calculating deviation of the estimated center position of the substrate from the center position of the substrate receiving portion; and moving the substrate transfer member so that the deviation is offset.

8. A substrate position detection apparatus used in a semiconductor fabrication apparatus provided with a process chamber where a predetermined process is carried out with respect to a substrate, and a susceptor that is rotatably housed in the process chamber and has a substrate receiving portion in which the substrate subject to a position detection is placed, to thereby detect a position of a substrate, the substrate position detection apparatus comprising:

an image taking unit that takes an image of an area that includes:

first two position detection marks provided in the process chamber so that the first two position detection marks are within the image taking area, wherein a first perpendicular bisector of the first two position detection marks passes through a rotational center of the susceptor;

second two position detection marks provided in the susceptor so that the second two position detection marks can be within the image taking area, wherein a second perpendicular bisector of the second two position detection marks passes through the rotational center of the susceptor and a center of the substrate receiving portion, and a circumferential area of the substrate receiving portion; and a control portion that detects the first two position detection marks and the second two position detection marks in accordance with the image taken by the image taking unit and determines whether the substrate receiving portion is positioned in a predetermined range in accordance with the detected first two position detection marks and the detected second two position detection marks.

9. The substrate position detection apparatus of claim 8, wherein the control portion determines whether the substrate receiving portion is positioned in a predetermined range in accordance with an angle defined by the first perpendicular bisector obtained based on the detected first two position detection marks and the second perpendicular bisector obtained based on the detected second two position detection marks.

10. A film deposition apparatus for depositing a film on a substrate by carrying out a cycle of alternately supplying at least two kinds of reaction gases that react with each other to the substrate to produce a layer of a reaction product in a chamber, the film deposition apparatus comprising:

- a susceptor rotatably provided in the chamber;
- a substrate receiving portion that is provided in one surface of the susceptor and the substrate is placed in;
- the substrate position detection apparatus of claim 8 for detecting a position of the substrate placed in the substrate receiving portion;
- a first reaction gas supplying portion configured to supply a first reaction gas to the one surface;
- a second reaction gas supplying portion configured to supply a second reaction gas to the one surface, the second reaction gas supplying portion being separated from the first reaction gas supplying portion along a rotational direction of the susceptor;
- a separation area located along the rotational direction between a first process area in which the first reaction gas is supplied and a second process area in which the second reaction gas is supplied;
- a center area that is located substantially in a center portion of the chamber in order to separate the first process area and the second process area, and has an ejection hole that ejects a first separation gas along the one surface; and
- an evacuation opening provided in the chamber in order to evacuate the chamber;

wherein the separation area includes
- a separation gas supplying portion that supplies a second separation gas, and
- a ceiling surface that creates in relation to the one surface of the susceptor a thin space in which the second separation gas may flow from the separation area to the process area side in relation to the rotation direction.

* * * * *